(12) United States Patent
Wober

(10) Patent No.: US 8,748,799 B2
(45) Date of Patent: Jun. 10, 2014

(54) FULL COLOR SINGLE PIXEL INCLUDING DOUBLET OR QUADRUPLET SI NANOWIRES FOR IMAGE SENSORS

(75) Inventor: Munib Wober, Topsfield, MA (US)

(73) Assignee: Zena Technologies, Inc., Cambridge, MA (US)

( * ) Notice: Subject to any disclaimer, the term of this patent is extended or adjusted under 35 U.S.C. 154(b) by 281 days.

(21) Appl. No.: 12/967,880

(22) Filed: Dec. 14, 2010

(65) Prior Publication Data

US 2012/0145880 A1 Jun. 14, 2012

(51) Int. Cl.
*H01L 31/00* (2006.01)
(52) U.S. Cl.
USPC ........................ 250/214.1; 977/762
(58) Field of Classification Search
USPC ............... 250/208.1, 214.1, 214 R; 977/762; 257/21
See application file for complete search history.

(56) References Cited

U.S. PATENT DOCUMENTS

| | | |
|---|---|---|
| 1,918,848 A | 4/1929 | Land |
| 3,903,427 A | 9/1975 | Pack |
| 4,017,332 A | 4/1977 | James |
| 4,357,415 A | 11/1982 | Hartman |
| 4,387,265 A | 6/1983 | Dalal |
| 4,400,221 A | 8/1983 | Rahilly |
| 4,443,890 A | 4/1984 | Eumurian |
| 4,513,168 A | 4/1985 | Borden |
| 4,620,237 A | 10/1986 | Traino et al. |
| 4,678,772 A | 7/1987 | Segal et al. |
| 4,827,335 A | 5/1989 | Saito |
| 4,846,556 A | 7/1989 | Haneda |
| 4,880,613 A | 11/1989 | Satoh |
| 4,896,941 A | 1/1990 | Hayashi |
| 4,950,625 A | 8/1990 | Nakashima |
| 4,971,928 A | 11/1990 | Fuller |
| 4,972,244 A | 11/1990 | Buffet |
| 5,096,520 A | 3/1992 | Faris |
| 5,124,543 A | 6/1992 | Kawashima |
| 5,247,349 A | 9/1993 | Olego |
| 5,272,518 A | 12/1993 | Vincent |
| 5,311,047 A | 5/1994 | Chang |
| 5,347,147 A | 9/1994 | Jones |
| 5,362,972 A | 11/1994 | Yazawa |
| 5,374,841 A | 12/1994 | Goodwin |
| 5,401,968 A | 3/1995 | Cox |
| 5,449,626 A | 9/1995 | Hezel |

(Continued)

FOREIGN PATENT DOCUMENTS

| | | |
|---|---|---|
| EP | 0809303 | 9/2006 |
| GB | 2348399 A | 4/2000 |

(Continued)

OTHER PUBLICATIONS

International Search Report and Written Opinion for PCT International Patent Application No. PCT/US2011/060348, mailed Mar. 9, 2012.

(Continued)

*Primary Examiner* — Thanh Luu
(74) *Attorney, Agent, or Firm* — Pillsbury Winthrop Shaw Pittman LLP

(57) ABSTRACT

An image sensor comprising a substrate and one or more of pixels thereon. The pixels have subpixels therein comprising nanowires sensitive to light of different color. The nanowires are functional to covert light of the colors they are sensitive to into electrical signals.

38 Claims, 9 Drawing Sheets

(56) References Cited

U.S. PATENT DOCUMENTS

| | | |
|---|---|---|
| 5,468,652 A | 11/1995 | Gee |
| 5,602,661 A | 2/1997 | Schadt |
| 5,612,780 A | 3/1997 | Rickenbach |
| 5,671,914 A | 9/1997 | Kalkhoran et al. |
| 5,696,863 A | 12/1997 | Kleinerman |
| 5,723,945 A | 3/1998 | Schermerhorn |
| 5,747,796 A | 5/1998 | Heard |
| 5,767,507 A | 6/1998 | Unlu |
| 5,798,535 A | 8/1998 | Huang |
| 5,844,290 A | 12/1998 | Furumiya |
| 5,853,446 A | 12/1998 | Carre |
| 5,857,053 A | 1/1999 | Kane |
| 5,877,492 A | 3/1999 | Fujieda |
| 5,880,495 A | 3/1999 | Chen |
| 5,885,881 A | 3/1999 | Ojha |
| 5,900,623 A | 5/1999 | Tsang et al. |
| 5,943,463 A | 8/1999 | Unuma |
| 5,968,528 A | 10/1999 | Deckner et al. |
| 6,033,582 A | 3/2000 | Lee |
| 6,037,243 A | 3/2000 | Ha et al. |
| 6,046,466 A | 4/2000 | Ishida et al. |
| 6,074,892 A | 6/2000 | Bowers et al. |
| 6,100,551 A | 8/2000 | Lee |
| 6,270,548 B1 | 8/2001 | Campbell |
| 6,301,420 B1 | 10/2001 | Greenaway et al. |
| 6,326,649 B1 | 12/2001 | Chang |
| 6,388,243 B1 | 5/2002 | Berezin |
| 6,388,648 B1 | 5/2002 | Clifton |
| 6,407,439 B1 | 6/2002 | Hier et al. |
| 6,459,034 B2 | 10/2002 | Muramoto et al. |
| 6,463,204 B1 | 10/2002 | Ati |
| 6,542,231 B1 | 4/2003 | Garrett |
| 6,563,995 B2 | 5/2003 | Kane et al. |
| 6,566,723 B1 | 5/2003 | Vook |
| 6,680,216 B2 | 1/2004 | Kwasnick et al. |
| 6,709,929 B2 | 3/2004 | Zhang |
| 6,720,594 B2 | 4/2004 | Rahn |
| 6,771,314 B1 | 8/2004 | Bawolek |
| 6,805,139 B1 | 10/2004 | Savas |
| 6,812,473 B1 | 11/2004 | Amemiya |
| 6,927,145 B1 | 8/2005 | Yang |
| 6,960,526 B1 | 11/2005 | Shah |
| 6,967,120 B2 | 11/2005 | Jang |
| 6,969,899 B2 | 11/2005 | Yaung |
| 6,987,258 B2 | 1/2006 | Mates |
| 6,996,147 B2 | 2/2006 | Majumdar |
| 7,052,927 B1 | 5/2006 | Fletcher |
| 7,064,372 B2 | 6/2006 | Duan |
| 7,105,428 B2 | 9/2006 | Pan |
| 7,109,517 B2 | 9/2006 | Zaidi |
| 7,153,720 B2 | 12/2006 | Augusto |
| 7,163,659 B2 | 1/2007 | Stasiak |
| 7,208,783 B2 | 4/2007 | Palsule |
| 7,230,286 B2 | 6/2007 | Cohen |
| 7,235,475 B2 | 6/2007 | Kamins |
| 7,241,434 B2 | 7/2007 | Anthony |
| 7,254,151 B2 | 8/2007 | Lieber |
| 7,262,400 B2 | 8/2007 | Yaung |
| 7,265,328 B2 | 9/2007 | Mouli |
| 7,272,287 B2 | 9/2007 | Bise et al. |
| 7,285,812 B2 | 10/2007 | Tang et al. |
| 7,306,963 B2 | 12/2007 | Linden |
| 7,307,327 B2 | 12/2007 | Bahl |
| 7,311,889 B2 | 12/2007 | Awano |
| 7,330,404 B2 | 2/2008 | Peng |
| 7,335,962 B2 | 2/2008 | Mouli |
| 7,336,860 B2 | 2/2008 | Cyr |
| 7,358,583 B2 | 4/2008 | Reznik |
| 7,381,966 B2 | 6/2008 | Starikov |
| 7,416,911 B2 | 8/2008 | Heath et al. |
| 7,446,025 B2 | 11/2008 | Cohen |
| 7,462,774 B2 | 12/2008 | Roscheisen |
| 7,471,428 B2 | 12/2008 | Ohara |
| 7,491,269 B2 | 2/2009 | Legagneux |
| 7,507,293 B2 | 3/2009 | Li et al. |
| 7,521,322 B2 | 4/2009 | Tang et al. |
| 7,524,694 B2 | 4/2009 | Adkisson et al. |
| 7,582,587 B2 | 9/2009 | Gruev |
| 7,582,857 B2 | 9/2009 | Gruev et al. |
| 7,598,482 B1 * | 10/2009 | Verhulst et al. ............ 250/214.1 |
| 7,622,367 B1 | 11/2009 | Nuzzo |
| 7,626,685 B2 | 12/2009 | Jin |
| 7,646,138 B2 | 1/2010 | Williams |
| 7,646,943 B1 | 1/2010 | Wober |
| 7,647,695 B2 | 1/2010 | MacNutt |
| 7,649,665 B2 | 1/2010 | Kempa et al. |
| 7,655,860 B2 | 2/2010 | Parsons |
| 7,663,202 B2 | 2/2010 | Wang et al. |
| 7,692,860 B2 | 4/2010 | Sato et al. |
| 7,704,806 B2 | 4/2010 | Chae |
| 7,713,779 B2 | 5/2010 | Firon |
| 7,719,678 B2 | 5/2010 | Kamins |
| 7,719,688 B2 | 5/2010 | Kamins |
| 7,732,769 B2 | 6/2010 | Snider |
| 7,732,839 B2 | 6/2010 | Sebe |
| 7,736,954 B2 | 6/2010 | Hussain |
| 7,740,824 B2 | 6/2010 | Godfried |
| 7,888,155 B2 | 2/2011 | Chen |
| 8,030,729 B2 | 10/2011 | Quitoriano |
| 8,035,184 B1 | 10/2011 | Dutta et al. |
| 8,049,203 B2 | 11/2011 | Samuelson et al. |
| 8,063,450 B2 | 11/2011 | Wernersson et al. |
| 8,067,299 B2 | 11/2011 | Samuelson et al. |
| 8,084,728 B2 | 12/2011 | Tsang |
| 8,093,675 B2 | 1/2012 | Tsunemi et al. |
| 8,118,170 B2 | 2/2012 | Sato |
| 8,143,658 B2 | 3/2012 | Samuelson et al. |
| 8,193,524 B2 | 6/2012 | Bjoerk et al. |
| 8,208,776 B2 | 6/2012 | Tokushima |
| 8,212,136 B2 | 7/2012 | Landis |
| 8,212,138 B2 | 7/2012 | Landis |
| 8,222,705 B2 | 7/2012 | Ogino |
| 8,242,353 B2 | 8/2012 | Karg |
| 8,269,985 B2 | 9/2012 | Wober |
| 8,274,039 B2 | 9/2012 | Wober et al. |
| 8,299,472 B2 | 10/2012 | Yu et al. |
| 8,330,090 B2 | 12/2012 | Agarwal |
| 8,384,007 B2 | 2/2013 | Yu et al. |
| 8,455,857 B2 | 6/2013 | Samuelson et al. |
| 8,546,742 B2 | 10/2013 | Wober |
| 2002/0003201 A1 | 1/2002 | Yu |
| 2002/0020846 A1 | 2/2002 | Pi et al. |
| 2002/0021879 A1 | 2/2002 | Lee |
| 2002/0104821 A1 | 8/2002 | Bazylenko |
| 2002/0109082 A1 | 8/2002 | Nakayama |
| 2002/0130311 A1 | 9/2002 | Lieber et al. |
| 2002/0172820 A1 | 11/2002 | Majumdar |
| 2003/0003300 A1 | 1/2003 | Korgel |
| 2003/0006363 A1 | 1/2003 | Campbell |
| 2003/0077907 A1 | 4/2003 | Kao et al. |
| 2003/0089899 A1 | 5/2003 | Lieber |
| 2003/0103744 A1 | 6/2003 | Koyama |
| 2003/0132480 A1 | 7/2003 | Chau |
| 2003/0189202 A1 | 10/2003 | Li et al. |
| 2003/0227090 A1 | 12/2003 | Okabe |
| 2004/0026684 A1 | 2/2004 | Empedocles |
| 2004/0058058 A1 | 3/2004 | Shchegolikhin |
| 2004/0065362 A1 | 4/2004 | Watabe |
| 2004/0075464 A1 | 4/2004 | Samuelson |
| 2004/0095658 A1 | 5/2004 | Buretea et al. |
| 2004/0109666 A1 | 6/2004 | Kim |
| 2004/0118337 A1 | 6/2004 | Mizutani |
| 2004/0118377 A1 | 6/2004 | Bloms |
| 2004/0122328 A1 | 6/2004 | Wang |
| 2004/0124366 A1 | 7/2004 | Zeng |
| 2004/0155247 A1 | 8/2004 | Benthien |
| 2004/0156610 A1 | 8/2004 | Charlton et al. |
| 2004/0180461 A1 | 9/2004 | Yaung |
| 2004/0213307 A1 | 10/2004 | Lieber |
| 2004/0217086 A1 | 11/2004 | Kawashima |
| 2004/0223681 A1 | 11/2004 | Block |
| 2004/0241965 A1 | 12/2004 | Merritt |
| 2004/0261840 A1 | 12/2004 | Schmit et al. |
| 2005/0009224 A1 | 1/2005 | Yang et al. |

(56) References Cited

U.S. PATENT DOCUMENTS

| | | |
|---|---|---|
| 2005/0082676 A1 | 4/2005 | Andry |
| 2005/0087601 A1 | 4/2005 | Gerst, III et al. |
| 2005/0095699 A1 | 5/2005 | Miyauchi et al. |
| 2005/0116271 A1 | 6/2005 | Kato |
| 2005/0133476 A1 | 6/2005 | Islam |
| 2005/0161662 A1 | 7/2005 | Majumdar et al. |
| 2005/0164514 A1 | 7/2005 | Rauf |
| 2005/0190453 A1 | 9/2005 | Dobashi |
| 2005/0201704 A1 | 9/2005 | Ellwood |
| 2005/0218468 A1 | 10/2005 | Owen |
| 2005/0242409 A1 | 11/2005 | Yang et al. |
| 2005/0284517 A1 | 12/2005 | Shinohara |
| 2006/0011362 A1 | 1/2006 | Tao |
| 2006/0038990 A1 | 2/2006 | Habib et al. |
| 2006/0113622 A1 | 6/2006 | Adkisson |
| 2006/0121371 A1 | 6/2006 | Wu |
| 2006/0146323 A1 | 7/2006 | Bratkovski |
| 2006/0162766 A1 | 7/2006 | Gee et al. |
| 2006/0260674 A1 | 11/2006 | Tran |
| 2006/0273262 A1 | 12/2006 | Sayag |
| 2006/0273389 A1 | 12/2006 | Cohen |
| 2006/0284118 A1 | 12/2006 | Asmussen |
| 2007/0012980 A1 | 1/2007 | Duan |
| 2007/0012985 A1 | 1/2007 | Stumbo |
| 2007/0023799 A1 | 2/2007 | Boettiger |
| 2007/0025504 A1 | 2/2007 | Tumer |
| 2007/0029545 A1 | 2/2007 | Striakhilev |
| 2007/0052050 A1 | 3/2007 | Dierickx |
| 2007/0076481 A1 | 4/2007 | Tennant |
| 2007/0082255 A1 | 4/2007 | Sun |
| 2007/0099292 A1 | 5/2007 | Miller |
| 2007/0104441 A1 | 5/2007 | Ahn et al. |
| 2007/0108371 A1 | 5/2007 | Stevens |
| 2007/0114622 A1 | 5/2007 | Adkisson |
| 2007/0120254 A1 | 5/2007 | Hurkx et al. |
| 2007/0126037 A1 | 6/2007 | Ikeda |
| 2007/0137697 A1 | 6/2007 | Kempa et al. |
| 2007/0138376 A1 | 6/2007 | Naughton |
| 2007/0138380 A1 | 6/2007 | Adkisson |
| 2007/0138459 A1 | 6/2007 | Wong |
| 2007/0139740 A1 | 6/2007 | Igura |
| 2007/0140638 A1 | 6/2007 | Yang |
| 2007/0145512 A1 | 6/2007 | Rhodes |
| 2007/0148599 A1 | 6/2007 | True |
| 2007/0152248 A1 | 7/2007 | Choi |
| 2007/0155025 A1 | 7/2007 | Zhang |
| 2007/0164270 A1 | 7/2007 | Majumdar |
| 2007/0170418 A1 | 7/2007 | Bowers |
| 2007/0172623 A1 | 7/2007 | Kresse |
| 2007/0187787 A1 | 8/2007 | Ackerson et al. |
| 2007/0196239 A1 | 8/2007 | Vink |
| 2007/0200054 A1 | 8/2007 | Reznik |
| 2007/0205483 A1 | 9/2007 | Williams |
| 2007/0217754 A1 | 9/2007 | Sasaki |
| 2007/0228421 A1 | 10/2007 | Shioya et al. |
| 2007/0238265 A1 | 10/2007 | Kurashina |
| 2007/0238285 A1 | 10/2007 | Borden |
| 2007/0241260 A1 | 10/2007 | Jaeger et al. |
| 2007/0246689 A1 | 10/2007 | Ge |
| 2007/0248958 A1 | 10/2007 | Jovanovich |
| 2007/0272828 A1 | 11/2007 | Xu |
| 2007/0285378 A1 | 12/2007 | Lankhorst |
| 2007/0290193 A1 | 12/2007 | Tucker |
| 2007/0290265 A1 | 12/2007 | Augusto |
| 2008/0001498 A1 | 1/2008 | Muller |
| 2008/0029701 A1 | 2/2008 | Onozawa |
| 2008/0036038 A1 | 2/2008 | Hersee |
| 2008/0044984 A1 | 2/2008 | Hsieh |
| 2008/0047601 A1 | 2/2008 | Nag |
| 2008/0047604 A1 | 2/2008 | Korevaar et al. |
| 2008/0055451 A1 | 3/2008 | Kanbe |
| 2008/0065451 A1 | 3/2008 | Kanbe |
| 2008/0073742 A1 | 3/2008 | Adkisson |
| 2008/0079022 A1 | 4/2008 | Yamamoto |
| 2008/0079076 A1 | 4/2008 | Sheen |
| 2008/0083963 A1 | 4/2008 | Hsu et al. |
| 2008/0088014 A1 | 4/2008 | Adkisson |
| 2008/0090401 A1 | 4/2008 | Bratkovski |
| 2008/0092938 A1 | 4/2008 | Majumdar |
| 2008/0096308 A1 | 4/2008 | Santori |
| 2008/0108170 A1 | 5/2008 | Adkisson |
| 2008/0116537 A1 | 5/2008 | Adkisson |
| 2008/0128760 A1 | 6/2008 | Jun |
| 2008/0145965 A1 | 6/2008 | Reznik |
| 2008/0149914 A1 | 6/2008 | Samuelson et al. |
| 2008/0149944 A1 | 6/2008 | Samuelson et al. |
| 2008/0157253 A1 | 7/2008 | Starikov |
| 2008/0166883 A1 | 7/2008 | Liu et al. |
| 2008/0169017 A1 | 7/2008 | Korevaar |
| 2008/0169019 A1 | 7/2008 | Korevaar |
| 2008/0173615 A1 | 7/2008 | Kim |
| 2008/0188029 A1 | 8/2008 | Rhodes |
| 2008/0191278 A1 | 8/2008 | Maekawa |
| 2008/0191298 A1 | 8/2008 | Lin |
| 2008/0211945 A1 | 9/2008 | Hong |
| 2008/0218740 A1 | 9/2008 | Williams |
| 2008/0224115 A1 | 9/2008 | Bakkers |
| 2008/0225140 A1 | 9/2008 | Raynor |
| 2008/0233280 A1 | 9/2008 | Blanchet |
| 2008/0237568 A1 | 10/2008 | Kobayashi |
| 2008/0246020 A1 | 10/2008 | Kawashima |
| 2008/0246123 A1 | 10/2008 | Kamins |
| 2008/0248304 A1 | 10/2008 | Hanrath |
| 2008/0251780 A1 | 10/2008 | Li |
| 2008/0258747 A1 | 10/2008 | Kluth |
| 2008/0260225 A1 | 10/2008 | Szu |
| 2008/0266556 A1 | 10/2008 | Kamins |
| 2008/0277646 A1 | 11/2008 | Kim et al. |
| 2008/0283728 A1 | 11/2008 | Inoue |
| 2008/0283883 A1 | 11/2008 | Shim |
| 2008/0297281 A1 | 12/2008 | Ayazi |
| 2008/0311693 A1 | 12/2008 | Maxwell |
| 2008/0311712 A1 | 12/2008 | Anwat et al. |
| 2009/0001498 A1 | 1/2009 | Wang |
| 2009/0020150 A1 | 1/2009 | Atwater et al. |
| 2009/0032687 A1 | 2/2009 | Lapstun |
| 2009/0046362 A1 | 2/2009 | Guo et al. |
| 2009/0046749 A1 | 2/2009 | Mizuuchi |
| 2009/0050204 A1 | 2/2009 | Habib |
| 2009/0057650 A1 | 3/2009 | Lieber |
| 2009/0072145 A1 | 3/2009 | Peczalski et al. |
| 2009/0121136 A1 | 5/2009 | Gruss et al. |
| 2009/0127442 A1 | 5/2009 | Lee |
| 2009/0146198 A1 | 6/2009 | Joe |
| 2009/0151782 A1 | 6/2009 | Ko |
| 2009/0152664 A1 | 6/2009 | Klem |
| 2009/0153961 A1 | 6/2009 | Murakami et al. |
| 2009/0165844 A1 | 7/2009 | Dutta |
| 2009/0173976 A1 | 7/2009 | Augusto |
| 2009/0179225 A1 | 7/2009 | Fertig et al. |
| 2009/0179289 A1 | 7/2009 | Park |
| 2009/0188552 A1 | 7/2009 | Wang |
| 2009/0189144 A1 | 7/2009 | Quitoriano |
| 2009/0189145 A1 | 7/2009 | Wang et al. |
| 2009/0199597 A1 | 8/2009 | Danley |
| 2009/0201400 A1 | 8/2009 | Zhang et al. |
| 2009/0206405 A1 | 8/2009 | Doyle |
| 2009/0224245 A1 | 9/2009 | Umezaki |
| 2009/0224349 A1 | 9/2009 | Gambino et al. |
| 2009/0230039 A1 | 9/2009 | Hoenig et al. |
| 2009/0233445 A1 | 9/2009 | Lee |
| 2009/0243016 A1 | 10/2009 | Kawahara et al. |
| 2009/0244514 A1 | 10/2009 | Jin |
| 2009/0260687 A1 | 10/2009 | Park |
| 2009/0261438 A1 | 10/2009 | Choi et al. |
| 2009/0266418 A1 | 10/2009 | Hu et al. |
| 2009/0266974 A1 | 10/2009 | Verhulst |
| 2009/0272423 A1 | 11/2009 | Niira |
| 2009/0278998 A1 | 11/2009 | El-Ghoroury et al. |
| 2009/0289320 A1 | 11/2009 | Cohen |
| 2009/0305454 A1 | 12/2009 | Cohen |
| 2010/0006817 A1 | 1/2010 | Ohlsson et al. |
| 2010/0019252 A1 | 1/2010 | Bratkovski et al. |
| 2010/0019296 A1 | 1/2010 | Cha |

(56) References Cited

U.S. PATENT DOCUMENTS

| | | |
|---|---|---|
| 2010/0019355 A1 | 1/2010 | Kamins |
| 2010/0090341 A1 | 4/2010 | Wan et al. |
| 2010/0101633 A1 | 4/2010 | Park et al. |
| 2010/0104494 A1 | 4/2010 | Meng |
| 2010/0110433 A1 | 5/2010 | Nedelcu et al. |
| 2010/0116976 A1 | 5/2010 | Wober |
| 2010/0127153 A1* | 5/2010 | Agarwal .................. 250/200 |
| 2010/0132779 A1 | 6/2010 | Hong |
| 2010/0133986 A1 | 6/2010 | Kim et al. |
| 2010/0136721 A1 | 6/2010 | Song |
| 2010/0148221 A1 | 6/2010 | Yu |
| 2010/0163714 A1 | 7/2010 | Wober |
| 2010/0163941 A1 | 7/2010 | Jung |
| 2010/0178018 A1 | 7/2010 | Augusto |
| 2010/0186809 A1 | 7/2010 | Samuelson et al. |
| 2010/0187404 A1 | 7/2010 | Klem |
| 2010/0200065 A1 | 8/2010 | Choi |
| 2010/0207103 A1 | 8/2010 | Farrow |
| 2010/0218816 A1 | 9/2010 | Guha |
| 2010/0229939 A1 | 9/2010 | Shen |
| 2010/0230653 A1 | 9/2010 | Chen |
| 2010/0237454 A1 | 9/2010 | Fujisawa |
| 2010/0244108 A1 | 9/2010 | Kohnke et al. |
| 2010/0244169 A1 | 9/2010 | Maeda et al. |
| 2010/0249877 A1 | 9/2010 | Naughton |
| 2010/0258184 A1 | 10/2010 | Laughlin |
| 2010/0276572 A1 | 11/2010 | Iwabuchi |
| 2010/0277607 A1 | 11/2010 | Choi et al. |
| 2010/0282314 A1 | 11/2010 | Coakley |
| 2010/0295019 A1 | 11/2010 | Wang et al. |
| 2010/0302440 A1 | 12/2010 | Wober |
| 2010/0304061 A1 | 12/2010 | Ye et al. |
| 2010/0308214 A1 | 12/2010 | Wober |
| 2010/0320444 A1 | 12/2010 | Dutta |
| 2011/0018424 A1 | 1/2011 | Takada |
| 2011/0036396 A1 | 2/2011 | Jayaraman |
| 2011/0037133 A1 | 2/2011 | Su et al. |
| 2011/0050042 A1 | 3/2011 | Choi et al. |
| 2011/0080508 A1 | 4/2011 | Katsuno et al. |
| 2011/0127490 A1 | 6/2011 | Mi |
| 2011/0133060 A1 | 6/2011 | Yu et al. |
| 2011/0133160 A1 | 6/2011 | Yu et al. |
| 2011/0135814 A1 | 6/2011 | Miyauchi et al. |
| 2011/0139176 A1 | 6/2011 | Cheung et al. |
| 2011/0146771 A1 | 6/2011 | Chuang et al. |
| 2011/0147870 A1 | 6/2011 | Ang et al. |
| 2011/0180894 A1 | 7/2011 | Samuelson |
| 2011/0195577 A1 | 8/2011 | Kushibiki et al. |
| 2011/0226937 A1 | 9/2011 | Yu et al. |
| 2011/0248315 A1 | 10/2011 | Nam et al. |
| 2011/0249219 A1 | 10/2011 | Evans et al. |
| 2011/0249322 A1 | 10/2011 | Wang et al. |
| 2011/0253982 A1 | 10/2011 | Wang et al. |
| 2011/0272014 A1 | 11/2011 | Mathai et al. |
| 2011/0297214 A1* | 12/2011 | Kim et al. .................. 136/255 |
| 2011/0309237 A1 | 12/2011 | Seo et al. |
| 2011/0315988 A1 | 12/2011 | Yu et al. |
| 2011/0316106 A1 | 12/2011 | Kim |
| 2012/0009714 A1 | 1/2012 | Mouli |
| 2012/0029328 A1 | 2/2012 | Shimizu |
| 2012/0075513 A1 | 3/2012 | Chipman et al. |
| 2012/0196401 A1 | 8/2012 | Graham et al. |
| 2012/0258563 A1 | 10/2012 | Ogino |

FOREIGN PATENT DOCUMENTS

| | | |
|---|---|---|
| JP | 359013708 A | 1/1984 |
| JP | 59198413708 | 1/1984 |
| JP | 2002151715 | 5/2002 |
| JP | 2005252210 | 9/2005 |
| JP | 2007201091 | 8/2007 |
| TW | 200845402 | 11/2008 |
| TW | 200915551 | 4/2009 |
| WO | 8603347 | 6/1986 |
| WO | 0002379 | 1/2000 |
| WO | WO03107439 | 12/2003 |
| WO | 2005064337 | 7/2005 |
| WO | 2008069565 | 6/2008 |
| WO | 2008079076 | 7/2008 |
| WO | 2008131313 | 10/2008 |
| WO | 2008135905 | 11/2008 |
| WO | 2008135905 A3 | 11/2008 |
| WO | 2008143727 | 11/2008 |
| WO | 2009116018 | 9/2009 |
| WO | 2009137241 | 11/2009 |
| WO | 2010019887 | 2/2010 |
| WO | 2010039631 | 4/2010 |

OTHER PUBLICATIONS

International Search Report and Written Opinion for PCT International Patent Application No. PCT/US2011/064635, mailed Apr. 13, 2012.

International Search Report and Written Opinion for PCT International Patent Application No. PCT/US2011/066097, mailed Mar. 12, 2012.

International Search Report and Written Opinion for PCT International Patent Application No. PCT/US2011/067712, mailed May 3, 2012.

International Preliminary Report and Written Opinion re PCT/US2010/059491, mailed Jun. 21, 2012.

International Search Report and Written Opinion re PCT/US2011/57325, mailed Jun. 22, 2012.

International Preliminary Report and Written Opinion re PCT/US2010/059468, mailed Jun. 21, 2012.

International Preliminary Report and Written Opinion re PCT/US2010/059504, mailed Jun. 21, 2012.

International Preliminary Report and Written Opinion re PCT/US2010/059496, mailed Jun. 21, 2012.

U.S. Office Action for U.S. Appl. No. 12/573,582, dated Jun. 28, 2012.

William Shockley and H. Queisser, Detailed Balance Limit of Efficiency of p-n Junction Solar Cells, J. of Appl. Physics, Mar. 1961, 32(3).

International Preliminary Report on Patentability for PCT International Application No. PCT/US2010/035722, mailed Nov. 3, 2011.

U.S. Office Action for U.S. Appl. No. 13/494,661, notification date Nov. 7, 2012.

International Preliminary Search Report on Patentability of PCT/US201-057325, mailed May 2, 2013.

Deptuch et al., Vertically Integrated Circuits at Fermilab, IEEE Transactions on Nuclear Science, Aug. 2010, vol. 54, Issue 4, pp. 2178-2186.

Gadelrab et al., The Source-Gated Amorphous Silicon Photo-Transistor, IEEE Transactions on Electron Devices, Oct. 1997, vol. 44, No. 10, pp. 1789-1794.

Guillaumée, et al., Polarization Sensitive Silicon Photodiodes Using Nanostructured Metallic Grids, Applied Physics Letters 94, 2009.

Junger, et. al., Polarization- and wavelength-sensitive sub-wavelength structures fabricated in the metal layers of deep submicron CMOS processes, Proc. of SPIE, vol. 7712, 2010.

Lin et al., Reducing Dark Current in a High-Speed Si-Based Interdigitated Trench-Electrode MSM Photodetector, IEEE Transactions on Electron Devices, May 2003, vol. 50, No. 5, pp. 1306-1313.

Loose et al., CMOS Detector Technology, Scientific Detector Workshop, Sicily, 2005, Experimental Astronomy, vol. 19, Issue 1-3, pp. 111-134.

Ye et al., Fabrication Techniques of High Aspect Ratio Vertical Lightpipes Using a Dielectric Photo Mask, SPIE, Proceedings, Feb. 2010, vol. 7591.

CMOS image sensor pixel microlens array optimization using FDTD Solutions, http://www.lumerical_com/ fdtd_microlens/cmos_image_sensor_pixel_microlens.php, pp. 1-2, Jun. 25, 2008.

"CMOS image sensor pixel optical efficiency and optical crosstalk optimization using FDTD Solutions" www.lumerical.com/fdtd_microlens/cmos_image_sensor_pixel_microlens.php, Mar. 19, 2009.

(56) References Cited

OTHER PUBLICATIONS

Adler, Nanowire Lawns Make for Sheets of Image Sensors, NewScientist.com, Jul. 28, 2008.
Babinec et al., High-Flux, Low-Power Diamond Nanowire Single-Photon Source Arrays: An Enabling Material for Optical and Quantum Computing and Cryptography, obtained on Jul. 22, 2010 at URL: <http://otd.harvard.edu/technologies/tech.php?case=3702>.
Baillie et al., 'Zero-space microlenses for CMOS image sensors: optical modeling and lithographic process development', Publication Date May 2004, http://adsabs.harvard.edu/abs/2004SPIE.5377..953B, pp. 1-2.vbTab.
Barclay et al., Chip-Based Microcavities Coupled to NV Centers in Single Crystal Diamond, Applied Physics Letters, Nov. 12, 2009, vol. 95, Issue 19.
Brouri et al., Photon Antibunching in the Flurescence of Individual Colored Centers in Diamond, Optics Letters, Sep. 1, 2000, vol. 25, Issue 17.
Chung, Sung-Wook et al. Silicon Nanowire Devices. Applied Physics Letters, vol., 76, No. 15 (Apr. 10, 2000), pp. 2068-2070.
Ekroll, On the Nature of Simultaneous Color Contrast, Dissertation, University of Kiel, 2005.
Fan et al., Large-Scale, Heterogeneous Integration of Nanowire Arrays for Image Sensor Circuitry, Proceedings of the National Academy of Sciences (PNAS) of the United States of America, Aug. 12, 2008, vol. 105, No. 32.
Fang et al., Fabrication of Slantingly-Aligned Silicon Nanowire Arrays for Solar Cell Applications, Nanotechnology, 2008, vol. 19, No. 25.
Furumiya, et al. "High-sensitivity and no-crosstalk pixel technology for embedded CMOS image sensor"; IEEE Electron Device Letters, vol. 48, No. 10, Oct. 2001.
Gambino et al., 'CMOS Imager with Copper Wiring and Lightpipe,' Electron Devices Meeting, 2006. IEDM '06, International Publication Date: Dec. 11-13, 2006, pp. 1-4.
Garnett et al., Light Trapping in Silicon Nanowire Solar Cells, Nanoletters, Jan. 28, 2010, vol. 10, No. 3, pp. 1082-1087.
Ge et al., Orientation-Controlled Growth of Single-Crystal Silicon-Nanowire Arrays, Advanced Materials, Jan. 18, 2005, vol. 17, No. 1, pp. 56-61.
Hanrath et al., Nucleation and Growth of Germanium Nanowires Seeded by Organic Monolayer-Coated Gold Nanocrystals, J. Am. Chem. Soc., Feb. 20, 2002, vol. 124, No. 7, pp. 1424-1429.
Hanrath et al., Supercritical Fluid-Liquid-Solid (SFLS) Synthesis of Si and Ge Nanowires Seeded by Colloidal Metal Nanocrystals, Advanced Materials, Mar. 4, 2003, vol. 15, No. 5, pp. 437-440.
Hochbaum et al., Controlled Growth of Si Nanowire Arrays for Device Integration, Nano Letters, Mar. 2005, vol. 5, No. 3, pp. 457-460.
Holmes et al., Control of Thickness and Orientation of Solution-Grown Silicon Nanowires, Science, Feb. 25, 2000, vol. 287, No. 5457, pp. 1471-1473.
International Preliminary Report on Patentability for PCT International Patent Application No. PCT/U62009/055963, mailed Mar. 17, 2011.
International Search Report and Written Opinion for PCT International Application No. PCT/US2010/035722, mailed Jul. 20, 2010.
International Search Report and Written Opinion for PCT International Application No. PCT/US2010/035726, mailed Jul. 21, 2010.
International Search Report and Written Opinion for PCT International Application No. PCT/US2010/057227, mailed Jan. 26, 2011.
International Search Report and Written Opinion for PCT International Patent Application No. PCT/US2009/055963, mailed Oct. 15, 2009.vbTab.
International Search Report and Written Opinion for PCT International Patent Application No. PCT/US2010/035727, mailed Sep. 27, 2010.
International Search Report and Written Opinion for PCT International Patent Application No. PCT/US2010/051435, mailed Dec. 3, 2010.
International Search Report and Written Opinion for PCT International Patent Application No. PCT/US2010/059468, mailed Feb. 11, 2011.
International Search Report and Written Opinion for PCT International Patent Application No. PCT/US2010/059491, mailed Feb. 9, 2011.
International Search Report and Written Opinion for PCT International Patent Application No. PCT/US2010/059501, mailed Feb. 15, 2011.
International Search Report and Written Opinion for PCT International Patent Application No. PCT/US2010/059504, mailed Apr. 7, 2011.
Juan et al., High Aspect Ratio Polymide Etching Using an Oxygen Plasma Generated by Electron Cyclotron Resonance Source, Journal of Vacuum Science and Technology, Jan./Feb. 1994, vol. 12, No. 1., pp. 422-426.
Kalkofen et al., Atomic Layer Deposition of Boron Oxide As Dopant Source for Shallow Doping of Silicon, Meeting Abstract 943, 217th ECS Meeting, MA2010-01, Apr. 25-30, 2010, Vancouver Canada, E1—Advanced Gate Stack, Source / Drain, and Channel Engineering for Si-Based CMOS 6: New Materials, Processes, and Equipment.
Kane, Why Nanowires Make Great Photodetectors, EurekAlert.com article, Apr. 25, 2007.
Kempa, Thomas J. et al. Single and Tandem Axial p-i-n Nanowire Photovoltaic Devices. Nano Letters. 2008, vol. 8, No. 10, 3456-3460.
Kim et al., Electronic Structure of Vertically Aligned Mn-Doped CoFe2O4 Nanowires and Their Application as Humidity Sensors and Photodetectors, Journal of Physical Chemistry C, Apr. 7, 2009.
Law, et al., 'Semiconductor Nanowires and Nanotubes'; Annu. Rev. Mater. Res. 2004, 34:83-122.
Lee et al., Vertical Pillar-Superlattice Array and Graphene Hybrid Light Emitting Diodes, Nano Letters, 2010, vol. 10, pp. 2783-2788.
Lin et al., Fabrication of Nanowire Anisotropic Conductive Film for Ultra-fine Pitch Flip Chip Interconnection, Electronic Components and Technology Conference, Jun. 20, 2005, 55th Proceedings, pp. 66-70.
Loncar et al., Diamond Nanotechnology, SPIE Newsroom, May 18, 2010, obtained at url: <http://spie.org/x40194.xml?ArticleID=x40194>.
Lu et al., Growth of Single Crystal Silicon Nanowires in Supercritical Solution from Tethered Gold Particles on a Silicon Substrate, NanoLetters, Jan. 2003, vol. 3, No. 1, pp. 93-99.
Lugstein et al., Ga/Au Alloy Catalyst for Single Crystal Silicon-Nanowire Epitaxy, Applied Physics Letters, Jan. 8, 2007, vol. 90, No. 2, pp. 023109-1-023109-3.
Madou, Properties and Growth of Silicon, Including Crystalline Silicon, Fundamentals of Microfabrication, 2nd Ed., CRC Press, 2002, pp. 125-204.
Makarova et al., Fabrication of High Density, High-Aspect-Ratio Polyimide Nanofilters, Journal of Vacuum Science and Technology, Nov./Dec. 2009, vol. 27, No. 6., pp. 2585-2587.
Morales et al., A Laser Ablation Method for the Synthesis of Crystalline Semiconductor Nanowires, Science, Jan. 9, 1998, vol. 279, pp. 208-211.
N.L. Dmitruk, et al.; 'Modeling and Measurement of Optical Response of 1D Array of Metallic Nanowires for Sensing and Detection Application'; 26th International Conference on Microelectronics (MIEL 2008), Nis, Serbia, May 11-14, 2008.
Nguyen et al., Deep Reactive Ion etching of Polyimide for Microfluidic Applications, Journal of the Korean Physical Society, Sep. 2007, vol. 51, No. 3, pp. 984-988.
Pain et al., A Back-Illuminated Megapixel CMOS Image Sensor, IEEE Workshop on Charge-Coupled Devices and Advanced Image Sensors, Karuizawa, Japan, Jun. 9-11, 2005, Jet Propulsion Laboratory, National Aeronautics and Space Administration, Pasadena California.
Parraga et al., Color and Luminance Information in Natural Scenes, Journal of Optical Society of America A, Optics, Image, Science and Vision, Jun. 1998, vol. 15, No. 6.
Rosfjord et al., Nanowire Single-Photon Detector with an Integrated Optical Cavity and Anti-Reflection Coating, Optics Express: The International Electronic Journal of Optics, Jan. 23, 2006, vol. 14, No. 2, pp. 527-534.

(56) References Cited

OTHER PUBLICATIONS

Rugani, First All-Nanowire Sensor, Technology Review, Aug. 13, 2008, Published by MIT.
Rutter, Diamond-Based Nanowire Devices Advance Quantum Science, SEAS Communications, Feb. 14, 2010, obtained at url:<http://news.harvard.edu/gazette/story/2010/02/digging-deep-into-diamonds/>.
Schmidt et al., Realization of a Silicon Nanowire Vertical Surround-Gate Field-Effect Transistor, Small, Jan. 2006, vol. 2, No. 1, pp. 85-88.
Song et al., Vertically Standing Ge Nanowires on GaAs(110) Substrates, Nanotechnology 19, Feb. 21, 2008.
T. H. Hsu, et al. 'Light Guide for Pixel Crosstalk Improvement in Deep Submicron CMOS Image Sensor'; IEEE Electron Device Letters, vol. 25, No. 1, Jan. 2004.
Thelander et al., Nanowire-Based One-Dimensional Electronics, Materials Today, Oct. 2006, vol. 9, No. 10, pp. 28-35.
Trentler, Timothy J. et al. Solution-Liquid-Solid Growth of Cyrstalline III-V Semiconductors: An Analogy to Vapor Liquid-Solid Growth. vol. 270(5243), Dec. 15, 1995, pp. 1791-1794.
Tseng, et al. 'Crosstalk improvement technology applicable to 0.14μm CMOS image sensor'; IEEE International Electron Devices Meeting, Dec. 13-15, 2004; IEDM Technical Digest, pp. 997-1000. vbTab.
Verheijen, Marcel A. et al. Growth Kinetics of Heterostructured GaP-GaAs Nanowires. J. Am. Chem. Soc. 2006, 128, 1353-1359.
Wagner, R.S. and Ellis, W.C. Vapor-Liquid-Solid Mechanism of Single Crystal Growth. Applied Physics Letters. vol. 4, No. 5 (Mar. 1, 1964), pp. 89-90.
Wong et al., Lateral Nanoconcentrator Nanowire Multijunction Photovoltaic Cells, GCEP Progress report, Apr. 20, 2009, pp. 1-18.
Zhang et al., Ultrahigh Responsivity Visible and Infrared Detection Using Silicon Nanowire Phototransistors, Nanoletters, May 14, 2010, vol. 10, No. 6, pp. 2117-2120.
International Search Report and Written Opinion for PCT International Patent Application No. PCT/US2010/051446, mailed Jan. 3, 2011.
International Search Report and Written Opinion for PCT International Patent Application No. PCT/US2009/063592, mailed Jan. 13, 2010.
Baomin Wang and Paul W. Leu, Nanotechology 23 (2012) 194003, 7 pages.
Sangmoo Jeon, et al., Nano Lett. 2012, 12, 2971-2976.
Sangmoo Jeong et al., J. Vac. Sci. Technol. A 30(6), Nov./Dec. 2012.
Sarkar et. al., Integrated polarization-analyzing CMOS image sensor for detecting incoming light ray direction, Sensors Application Symposium (SAS), Mar. 29, 2012, p. 194-199, 1010 IEEE.
Jin-Kon Kim; 'New Functional Nanomaterials Based on Block Copolymers' http://www.ziu.edu.cn/adver/subjectizyhd/jz0707061313.html, Jul. 7, 2011.
U.S. Office Action for U.S. Appl. No. 13/048,635, mailed Jun. 6, 2013, 24 pages.
U.S. Office Action for U.S. Appl. No. 12/966,535, mailed Jun. 14, 2013, 22 pages.
Taiwanese Office Action of Taiwan Patent Application No. 099116881, issued Jul. 18, 2013.
Canadian Office Action of Canadian Application No. 3,676,376, dated Oct. 11, 2013.
Catrysse, et al., An Integrated Color Pixel in 0.18pm CMOS Technology, Proceedings IEDM 2001, pp. 559-562.
Choi et al., Optimization of sidewall roughness in silica waveguides to reduce propagation losses, May 2001, Lasers and Electro-Optics, 2001. CLEO '01. Technical Digest. Summaries of papers presented at the Conference on, pp. 175-176.
Geyer et al., Model for the Mass Transport during Metal-Assisted Chemical Etching with Contiguous Metal Films as Catalysts, J. Phys. Chem. C 2012, 116, 13446-13451.
Hopkins, Addressing sidewall roughness using dry etching silicon and Si02, Jul. 1, 2004, ElectroIQ, vol. 47, Issue 7.
Mei-Ling Kuo et al. "Realization of a near-perfect antireflection coating for silicon solar energy utilization" (Nov. 1, 2008, vol. 33, No. 21, Optics Letters).
Mukhopadhyay, When PDMS Isn't the Best, American Chemical Society, May 1, 2007.
Seo, et. al., "Multicolored vertical silicon nanowires," Nano Letters, \tali 1 issue 4, pp. 1851-6, 2010.
U.S. Final Office Action for U.S. Appl. No. 12/966,514, mailed Mar. 19, 2013, 50 pages.
U.S. Final Office Action for U.S. Appl. No. 13/494,661, mailed Mar. 7, 2013, 10 pages.
Wang, Introduction to Nanotechnology—Where Opportunities arise & Great Future Being Built from Small Things, Fall 2008.
Shimizu et al., Homoepitaxial Growth of Vertical Si Nanowires on Si(100) Substrate using Anodic Aluminum Oxide Template, (abstract only), Materials Research Society, Fall 2007.
Reynard Corporation; 'Anti-Reflection Coatings (AR)', http://www.reynardcorp.com/coating_anti_reflection.php, dowwnloaded Jun. 4, 2009.
Ozgur Yavuzcetin, et al.; 'Index-tuned Anti-reflective Coating using a Nanostructured Metamaterial'; http://www.umass.edu/research/rld/bioportal/vuewtech.php?tid=40, Feb. 28, 2007.
U.S. Office Action for U.S. Appl. No. 12/633,313, dated Aug. 1, 2013, 20 pages.
U.S. Office Action for U.S. Appl. No. 12/966,514, dated Aug. 15, 2013, 17 pages.
U.S. Office Action for U.S. Appl. No. 12/966,573, dated Aug. 6, 2013, 13 pages.

* cited by examiner

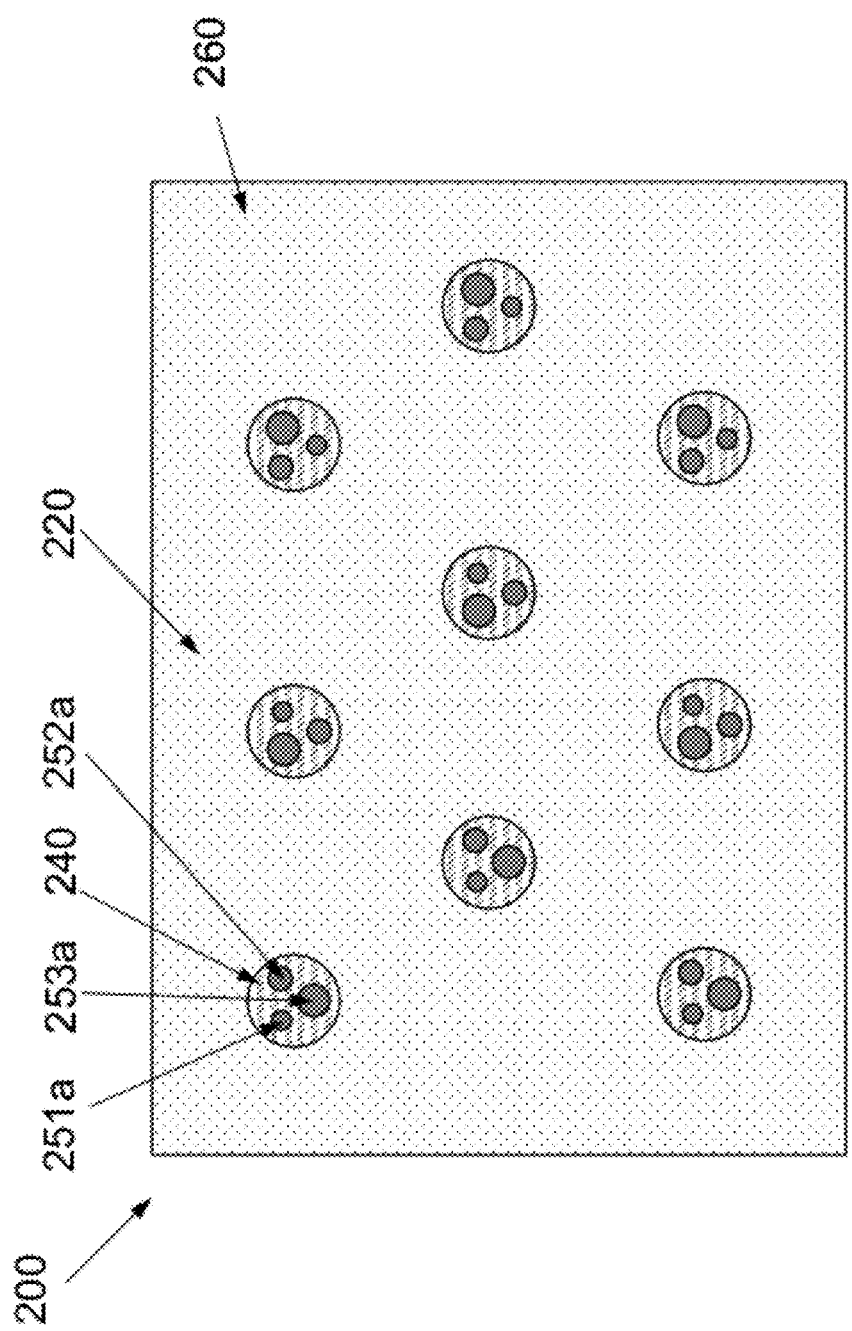

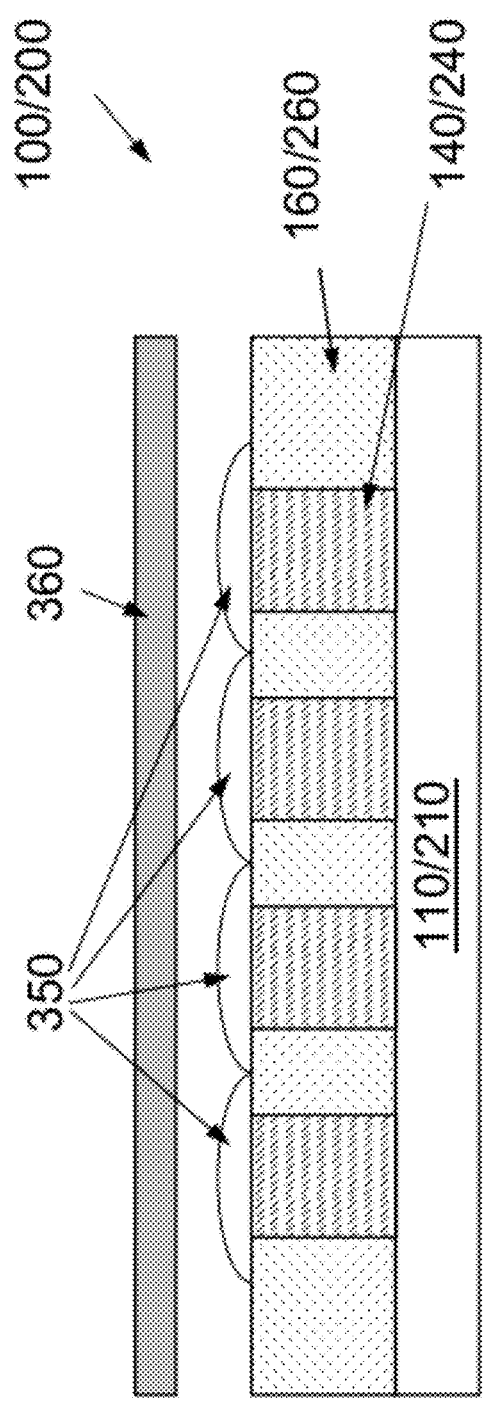

FULL COLOR SINGLE PIXEL INCLUDING DOUBLET OR QUADRUPLET SI NANOWIRES FOR IMAGE SENSORS

CROSS-REFERENCE TO RELATED APPLICATIONS

This application is related to U.S. patent application Ser. Nos. 12/204,686 (granted as U.S. Pat. No. 7,646,943), 12/648,942 (granted as U.S. Pat. No. 8,229,255), 12/270,233 (granted as U.S. Pat. No. 8,274,039), 12/472,264 (granted as U.S. Pat. No. 8,269,985), 12/472,271, 12/478,598, 12/573,582, 12/575,221, 12/633,323, 12/633,318, 12/633,313, 12/633,305, 12/621,497, 12/633,297, 61/266,064, 61/357,429, 61/306,421, 12/945,492, 12/910,664, 12/966,514, 12/966,535 and 12/966,573, the disclosures of which are hereby incorporated by reference in their entirety.

BACKGROUND

An image sensor may be fabricated to have a large number of sensor elements (pixels), generally more than 1 million, in a (Cartesian) square grid. The pixels may be photodiodes, or other photosensitive elements, that are operable to convert electromagnetic radiation (light) into electrical signals.

Recent advances in semiconductor technologies have enabled the fabrication of nanostructures such as nanotubes, nanocavities and nanowires. Optical properties of nanostructures have been one of the recent research focuses. Among the available nanostructures, nanowires have drawn a lot of interest because of their usefulness as an optoelectronic sensor element. An image sensor that harness unique optical properties of nanowires is therefore desirable.

SUMMARY

Described herein is an image sensor comprising a substrate and one or more of pixels thereon, wherein each of the pixels comprises a first subpixel and a second subpixel; the first subpixel comprises a first nanowire operable to generate an electrical signal upon exposure to light of a first wavelength; the second subpixel comprises a second nanowire operable to generate an electrical signal upon exposure to light of a second wavelength different from the first wavelength; the first and second nanowires extend essentially perpendicularly from the substrate. The term "image sensor" as used herein means a device that converts an optical image to an electric signal. An image sensor can be used in digital cameras and other imaging devices. Examples of image sensors include a charge-coupled device (CCD) or a complementary metal-oxide-semiconductor (CMOS) active pixel sensor. The term "pixel" as used herein means the smallest addressable light-sensing element of an image sensor. Each pixel is individually addressable. Pixels in an image sensor can be arranged in a two-dimensional grid. Each pixel samples characteristics such as intensity and color of a small area of an image projected onto the image sensor. The color sampled by a pixel can be represented by three or four component intensities such as red, green, and blue, or cyan, magenta, yellow, and black. Many image sensors are, for various reasons, not capable of sensing different colors at the same location. Therefore, each pixel is divided into regions known as "subpixels", each of the regions being capable of sensing a single color. The color sampled by a pixel can be calculated from the single colors sensed by the subpixels in the pixel. The term nanowires "extending essentially perpendicularly from the substrate" as used herein means that angles between the nanowires and the substrate are from 85° to 90°. The term "nanowire" as used herein means a structure that has a size constrained to at most 1000 nm in two dimensions and unconstrained in the other dimension.

According to an embodiment, each pixel of the image sensor can further comprise one or more photodiodes located between the substrate and the nanowires. The term "photodiode" as used herein means a type of photodetector capable of converting light into either current or voltage. A photodiode can have a p-n junction or p-i-n junction. When a photon of sufficient energy strikes the photodiode, it excites an electron, thereby creating a free electron and a hole. The electron and hole can be collected to at electrodes of the photodiode as a current or voltage.

According to an embodiment, the substrate comprises silicon, silicon oxide, silicon nitride, sapphire, diamond, silicon carbide, gallium nitride, germanium, indium gallium arsenide, lead sulfide and/or a combination thereof.

According to an embodiment, at least one pixel of the image sensor comprises a clad; the first subpixel and the second subpixel of the at least one pixel are embedded in the clad. The term "clad" as used herein means a layer of substance surrounding the subpixels. The term "embed" as used herein means to surround or cover something closely.

According to an embodiment, the image sensor further comprises a material in space between the pixels.

According to an embodiment, the clad comprises silicon nitride, silicon oxide, and/or a combination thereof.

According to an embodiment, the clad is substantially transparent to visible light.

According to an embodiment, the first and second nanowires have refractive indexes equal to or greater than a refractive index of the clad.

According to an embodiment, the material has a refractive index smaller than a refractive index of the clad.

According to an embodiment, the first nanowire and the second nanowire have different absorption spectra. The term "absorptance" as used herein means a fraction of light absorbed at a specified wavelength. The term "absorption spectrum" as used herein means absorptance as a function of wavelength.

According to an embodiment, the first nanowire and the second nanowire have a distance of at least 100 nm.

According to an embodiment, each of the first and second nanowires has a p-n or p-i-n junction therein. The term "p-i-n junction" as used herein means a structure of a lightly doped or intrinsic semiconductor region sandwiched between a p-type semiconductor region and an n-type semiconductor region. The p-type and n-type regions can be heavily doped for Ohmic contacts. The term "p-n junction" as used herein means a structure with a p-type semiconductor region and an n-type semiconductor region in contact with each other.

According to an embodiment, the electrical signal comprise an electrical voltage, an electrical current, an electrical conductance or resistance, and/or a change thereof.

According to an embodiment, the first nanowire and/or the second nanowire has a surface passivation layer. The terms "passivation" and "passivate" as used herein means a process of eliminating dangling bonds (i.e., unsatisfied valence on immobilized atoms).

According to an embodiment, the image sensor is operable to absorb substantially all (e.g. >50%, >70%, or >90%) visible light (light with wavelengths of about 390 to 750 nm.) impinged thereon. Absorbing >50%, 70% or 90% of all visible light as used herein means that the image sensor has absorptance greater than 50%, greater than 70%, or greater than 90% across the entire visible spectrum (about 390 to 750 nm wavelength), respectively.

According to an embodiment, the image sensor further comprises electronic circuitry operable to detect electrical signals generated by the first and second nanowires.

According to an embodiment, the first and second nanowires comprise silicon.

According to an embodiment, the first nanowire has a radius of about 25 nm (e.g. from 23 to 27 nm) and the second nanowire has a radius of about 40 nm (e.g. from 38 to 42 nm).

According to an embodiment, the clad has a cylindrical shape with a diameter of about 300 nm (e.g. 280 to 320 nm).

According to an embodiment, the pixels have different orientations. The term "different orientations" as used herein is illustrated in FIGS. 1B and 2B and means a pixel is rotated and offset laterally relative to a neighbor pixel thereof.

According to an embodiment, the photodiodes have absorption spectra different from absorption spectra of the first and second nanowires. Two absorption spectra being "different" as used herein means the absorption spectra have different absorptance at one or more one wavelength.

According to an embodiment, each of the pixels further comprises a third subpixel and the third subpixel comprises a third nanowire operable to generate an electrical signal upon exposure to light of a third wavelength different from the first and second wavelengths, wherein the third nanowire extends essentially perpendicularly from the substrate.

According to an embodiment, the third nanowire comprises silicon.

According to an embodiment, the third nanowire has a radius of about 45 nm (e.g. from 42 to 48 nm).

According to an embodiment, the image sensor further comprises couplers above each of the pixels, each of the couplers having a convex surface and being effective to focus substantially all visible light impinged thereon into the clad.

According to an embodiment, each of the couplers has substantially the same footprint as the pixel underneath. The term "footprint" as used herein means an area perpendicularly projected by a structure such as a pixel or a coupler on the substrate.

According to an embodiment, the image sensor further comprises an infrared filter operable to prevent infrared light from reaching the pixels. The term "infrared light" as used herein means electromagnetic radiation with a wavelength between 0.7 and 300 micrometers. The term "infrared filter" as used herein means a device operable to reflect or block infrared light while allowing visible light to pass through.

According to an embodiment, the image sensor does not comprise an infrared filter.

According to an embodiment, the first nanowire and/or the second nanowire has a transistor therein or thereon. A "transistor" as used herein means a semiconductor device used to amplify and switch electronic signals. It is made of a solid piece of semiconductor material, with at least three terminals for connection to an external circuit. A voltage or current applied to one pair of the transistor's terminals changes the current flowing through another pair of terminals.

According to an embodiment, the image sensor further comprises electronic circuitry operable to detect electrical signals from the photodiodes.

According to an embodiment, a method of manufacturing an image sensor, comprising dry etching or VLS growth, wherein the image sensor comprises a substrate and one or more of pixels thereon, wherein each of the pixels comprises at a first subpixel and a second subpixel, the first subpixel comprises a first nanowire operable to generate an electrical signal upon exposure to light of a first wavelength, the second subpixel comprises a second nanowire operable to generate an electrical signal upon exposure to light of a second wavelength different from the first wavelength, wherein the first and second nanowires extend essentially perpendicularly from the substrate. The VLS growth is a method for the growth of one-dimensional structures, such as nanowires, from chemical vapor deposition. Growth of a crystal through direct adsorption of a gas phase on to a solid surface is generally very slow. The VLS growth circumvents this by introducing a catalytic liquid alloy phase which can rapidly adsorb a vapor to supersaturation levels, and from which crystal growth can subsequently occur from nucleated seeds at the liquid-solid interface. The physical characteristics of nanowires grown in this manner depend, in a controllable way, upon the size and physical properties of the liquid alloy.

According to an embodiment, a method of sensing an image comprises: projecting the image onto an image sensor, wherein the image sensor comprises a substrate and one or more of pixels thereon, wherein each of the pixels comprises at a first subpixel and a second subpixel, the first subpixel comprises a first nanowire operable to generate an electrical signal upon exposure to light of a first wavelength, the second subpixel comprises a second nanowire operable to generate an electrical signal upon exposure to light of a second wavelength different from the first wavelength, wherein the first and second nanowires extend essentially perpendicularly from the substrate; detecting the electrical signals from the first nanowire and the second nanowire; calculating a color of each pixel from the electrical signals.

BRIEF DESCRIPTION OF THE DRAWINGS

Embodiments of the present disclosure will now be disclosed, by way of example only, with reference to the accompanying schematic drawings in which corresponding reference symbols indicate corresponding parts, in which:

FIG. 2B shows a schematic top view of the image sensor of FIG. 2A.

FIG. 3 shows a schematic of couplers and an infrared filter.

DETAILED DESCRIPTION

Figure 1A:
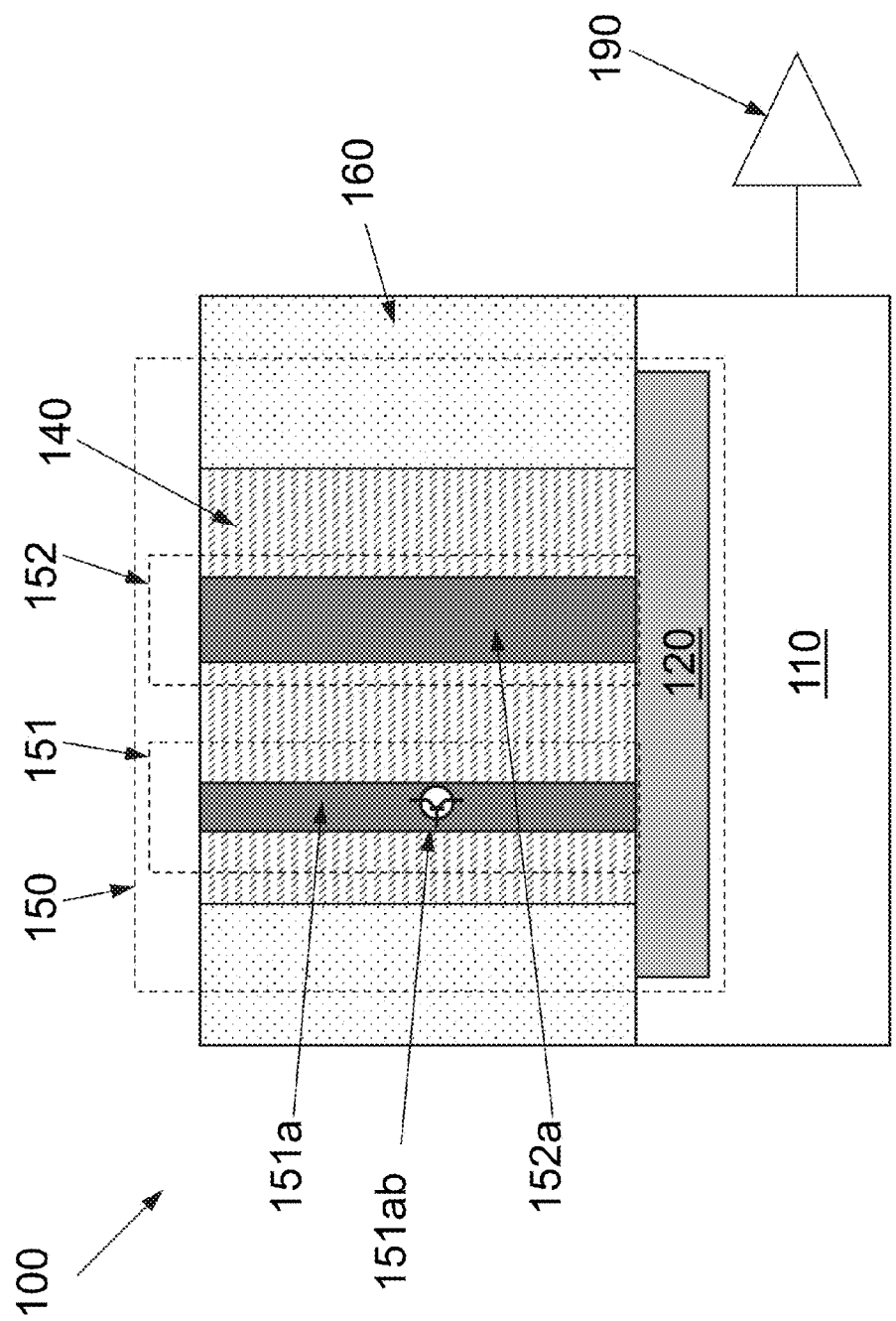
FIG. 1A shows a schematic cross-sectional view of an image sensor according to an embodiment.

In the following detailed description, reference is made to the accompanying drawings, which form a part thereof. In the drawings, similar symbols typically identify similar components, unless the context dictates otherwise. The illustrative embodiments described in the detail description, drawings, and claims are not meant to be limiting. Other embodiments may be utilized, and other changes may be made, without departing from the spirit or scope of the subject matter presented here.

The human eye has photoreceptors (called cone cells) for medium- and high-brightness color vision, with sensitivity peaks in short (S, 420-440 nm), middle (M, 530-540 nm) and long (L, 560-580 nm) wavelengths (there is also the low-brightness monochromatic "night-vision" receptor, called rod cell, with peak sensitivity at 490-495 nm). Thus, in principle, three parameters describe a color sensation. The tristimulus values of a color are the amounts of three primary colors in a three-component additive color model needed to match that test color. The tristimulus values are most often given in the CIE 1931 color space, in which they are denoted X, Y, and Z.

In the CIE XYZ color space, the tristimulus values are not the S, M, and L responses of the human eye, but rather a set of tristimulus values called X, Y, and Z, which are roughly red, green and blue, respectively (note that the X, Y, Z values are not physically observed red, green, blue colors. Rather, they may be thought of as 'derived' parameters from the red, green, blue colors). Two light sources, made up of different mixtures of various wavelengths, may appear to be the same color; this effect is called metamerism. Two light sources have the same apparent color to an observer when they have the same tristimulus values, no matter what spectral distributions of light were used to produce them.

Due to the nature of the distribution of cones in the eye, the tristimulus values depend on the observer's field of view. To eliminate this variable, the CIE defined the standard (colorimetric) observer. Originally this was taken to be the chromatic response of the average human viewing through a 2° angle, due to the belief that the color-sensitive cones resided within a 2° arc of the fovea. Thus the CIE 1931 Standard Observer is also known as the CIE 1931 2° Standard Observer. A more modern but less-used alternative is the CIE 1964 10° Standard Observer, which is derived from the work of Stiles and Burch, and Speranskaya.

The color matching functions are the numerical description of the chromatic response of the observer as described above.

The CIE has defined a set of three color-matching functions, called, $\bar{x}(\lambda)$, $\bar{y}(\lambda)$, and $\bar{z}(\lambda)$, which can be thought of as the spectral sensitivity curves of three linear light detectors that yield the CIE XYZ tristimulus values X, Y, and Z. These functions are known collectively as the CIE standard observer.

The tristimulus values for a color with a spectral power distribution $I(\lambda)$ are given in terms of the standard observer by:

$$X = \int_0^\infty I(\lambda)\bar{x}(\lambda)d\lambda,$$
$$Y = \int_0^\infty I(\lambda)\bar{y}(\lambda)d\lambda,$$
$$Z = \int_0^\infty I(\lambda)\bar{z}(\lambda)d\lambda,$$

wherein $\lambda$ is the wavelength of the equivalent monochromatic light (measured in nanometers).

Examples

FIG. 1A shows a schematic partial cross-sectional view of an image sensor 100, according to an embodiment. The image sensor 100 comprises a substrate 110, one or more pixels 150. At least one pixel 150 comprises a clad 140 and a plurality of subpixels embedded in the clad 140. Two subpixels 151 and 152 are shown in FIG. 1A as an example. Each of the subpixels comprises a nanowire (e.g. a nanowire 151a in the subpixel 151 and a nanowire 152a in the subpixel 152) extending essentially perpendicularly from the substrate 110. Space between the pixels 150 is preferably filled with a material 160. Each pixel 150 can further comprise one or more photodiodes 120 located between the substrate 110 and the nanowires 151a and 152a.

The substrate 110 can comprise any suitable material such as silicon, silicon oxide, silicon nitride, sapphire, diamond, silicon carbide, gallium nitride, germanium, indium gallium arsenide, lead sulfide, and/or a combination thereof.

The photodiode 120 can be any suitable photodiode. The photodiode 120 can have a p-n junction of a p-i-n junction and any suitable circuitry. The photodiode 120 preferably has a footprint that completely encloses a footprint of the clad 140.

The clad 140 can comprise any suitable material, such as silicon nitride, silicon oxide, and/or a combination thereof. The clad 140 is preferably substantially transparent to visible light, preferably with a transmittance of at least 50%, more preferably at least 70%, most preferably at least 90%. In one example, the clad 140 is silicon nitride and has a cylindrical shape with a diameter of about 300 nm.

The material 160 can comprise any suitable material such as silicon dioxide. A refractive index of the material 160 is preferably smaller than a refractive index of the clad 140.

The nanowires (e.g. 151a and 152a) in the subpixels (e.g. 151 and 152) have refractive indexes equal to or greater than the refractive index of the clad 140. The nanowires and the photodiode 120 have different absorption spectra. For example, the nanowire 151a has strong absorptance in blue wavelengths, as shown by an exemplary absorption spectrum 181 in FIG. 1C; the nanowire 152a has a strong absorptance in green wavelengths, as shown by an exemplary absorption spectrum 182 in FIG. 1C; the photodiode 120 has strong absorptance in red wavelengths, as shown by an exemplary absorption spectrum 180 in FIG. 1C. The nanowires can have different diameters and/or different materials. Each nanowire in one pixel 150 preferably has a distance of at least 100 nm, preferable at least 200 nm, to a nearest neighboring nanowire in the same pixel. The nanowires can be positioned at any suitable positions in the clad 140.

The nanowires (e.g. 151a and 152a) in the subpixels (e.g. 151 and 152) are operable to generate electrical signals upon receiving light. One exemplary nanowire is a photodiode with a p-n or p-i-n junction therein, details of which can be found in U.S. patent application Ser. Nos. 12/575,221 and 12/633, 305, each of which is hereby incorporated by reference in its entirety. The electrical signals can comprise an electrical voltage, an electrical current, an electrical conductance or resistance, and/or a change thereof. The nanowires can have a surface passivation layer.

Substantially all visible light (e.g. >50%, >70%, or >90%) impinged on the image sensor 100 is absorbed by the subpixels (e.g. 151 and 152) and the photodiode 120. The subpixels and the photodiode absorb light with different wavelengths.

The image sensor 100 can further comprise electronic circuitry 190 operable to detect electrical signals from the subpixels and the photodiode 120.

In one specific example, each pixel 150 has two subpixels 151 and 152. Each subpixel 151 and 152 has only one nanowire 151a and 152a, respectively. The nanowire 151a comprises silicon, has a radius of about 25 nm, and has a strong absorptance in blue wavelengths. The nanowire 152a comprises silicon, has a radius of about 40 nm and has a strong absorptance in cyan wavelengths. The nanowires 151a and 152a are about 200 nm apart but embedded in the same clad 140. Each of the pixels 150 can have more than two subpixels according to an embodiment. The nanowires can comprise other suitable materials such as mercury cadmium telluride. The nanowires can have other suitable radii from 10 nm to 250 nm.

Figure 1B:
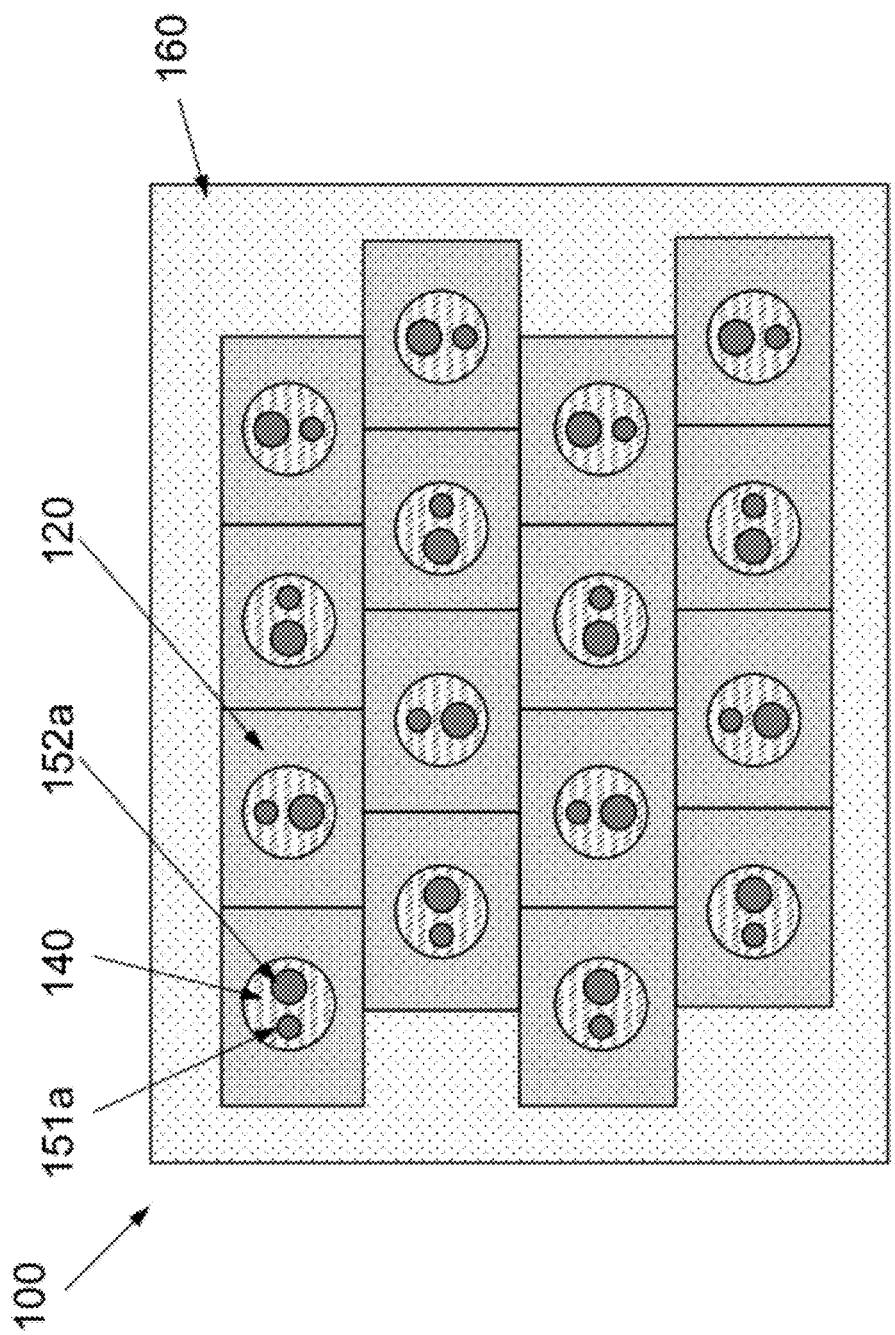
FIG. 1B shows a schematic top view of the image sensor of FIG. 1A.
Figure 1C:
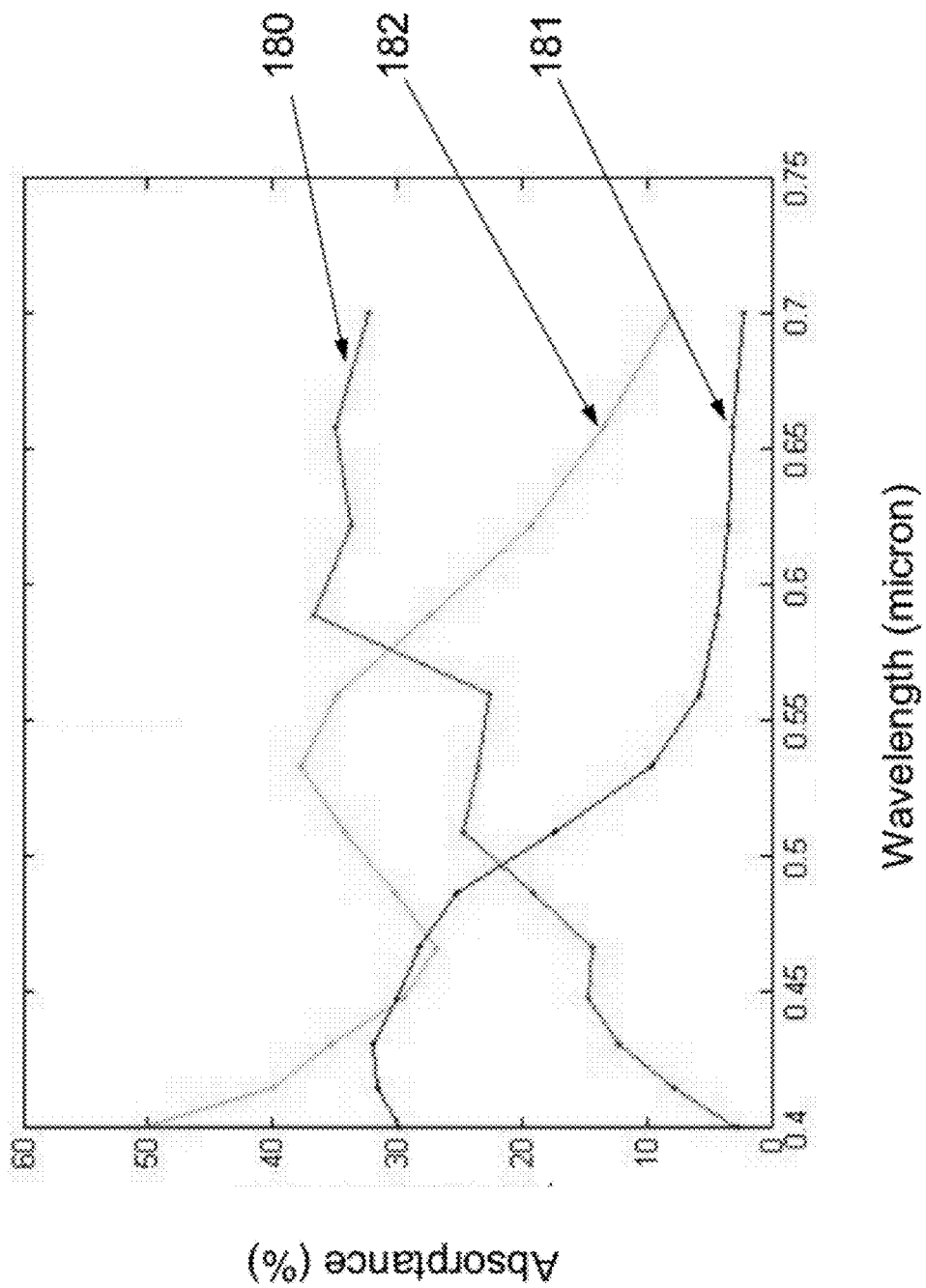
FIG. 1C shows exemplary absorption spectra of two nanowires in two subpixels in a pixel of the image sensor of FIG. 1A and a photodiode on the substrate of the image sensor of FIG. 1A.

FIG. 1B shows a schematic partial top view of the image sensor 100. As shown in exemplary FIG. 1B, the pixels 150 can have different orientations, which reduces or eliminates effects of directions of incident light.

In one embodiment, the subpixels 151 and 152 and the photodiode 120 in each pixel 150 of the image sensor 100 has color matching functions substantially the same as the color matching functions of the CIE 1931 2° Standard Observer or the CIE 1964 10° Standard Observer.

Figure 2A:
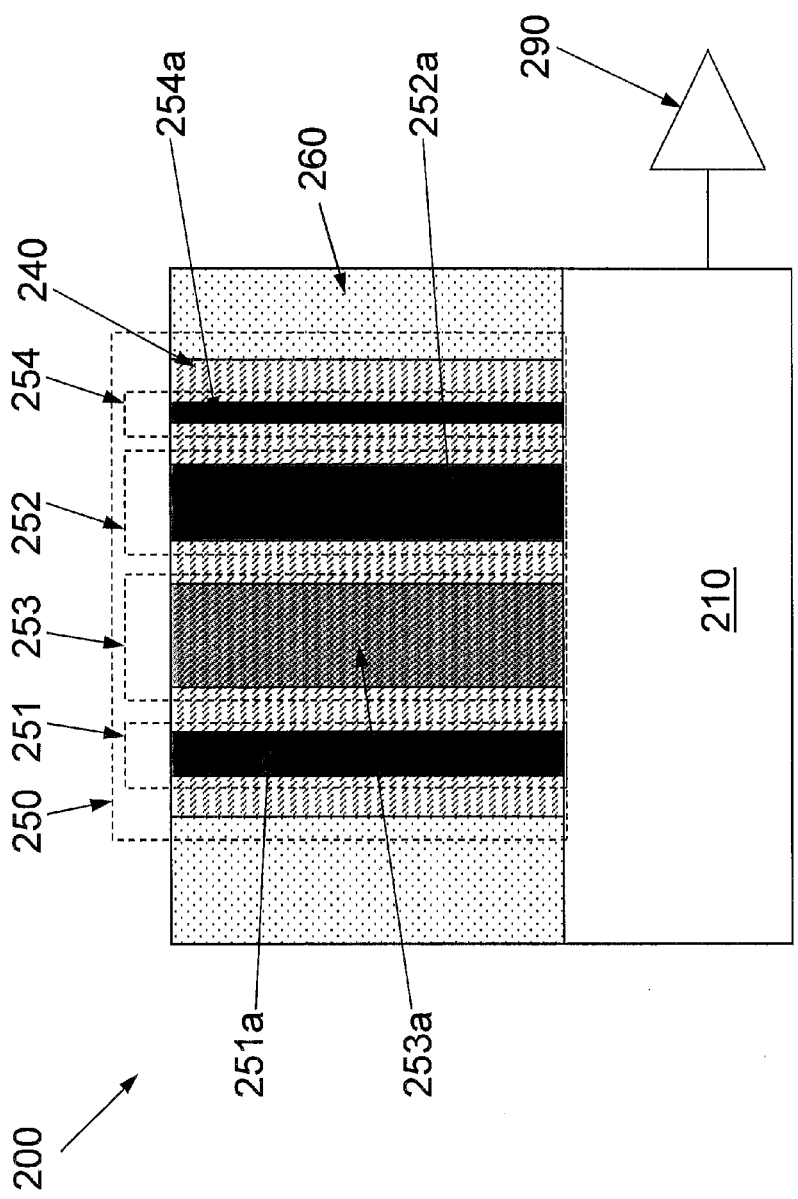
FIG. 2A shows a schematic cross-sectional view of an image sensor according to an embodiment.

FIG. 2A shows a schematic partial cross-sectional view of an image sensor 200, according to an embodiment. The image sensor 200 comprises a substrate 210, one or more pixels 250. The substrate 210 preferably does not comprise any photodiode therein. At least one pixel 250 comprises a clad 240 and a plurality of subpixels embedded in the clad 240. Three subpixels 251, 252 and 253 are shown in FIG. 2A as an example. Each of the subpixels comprises a nanowire (e.g. a nanowire 251a in the subpixel 251, a nanowire 252a in the subpixel 252 and a nanowire 253a in the subpixel 253) extending essentially perpendicularly from the substrate 210. Space between the pixels 250 is preferably filled with a material 260.

The substrate 210 can comprise any suitable material such as silicon, silicon oxide, silicon nitride, sapphire, diamond, silicon carbide, gallium nitride, germanium, indium gallium arsenide, lead sulfide and/or a combination thereof.

The clad 240 can comprise any suitable material, such as silicon nitride, silicon oxide, etc. The clad 240 is preferably substantially transparent to visible light, preferably with a transmittance of at least 50%, more preferably at least 70%, most preferably at least 90%. In one example, the clad 240 is silicon nitride and has a cylindrical shape with a diameter of about 300 nm.

The material 260 can comprise any suitable material such as silicon dioxide. A refractive index of the material 260 is preferably smaller than a refractive index of the clad 240.

Figure 2C:
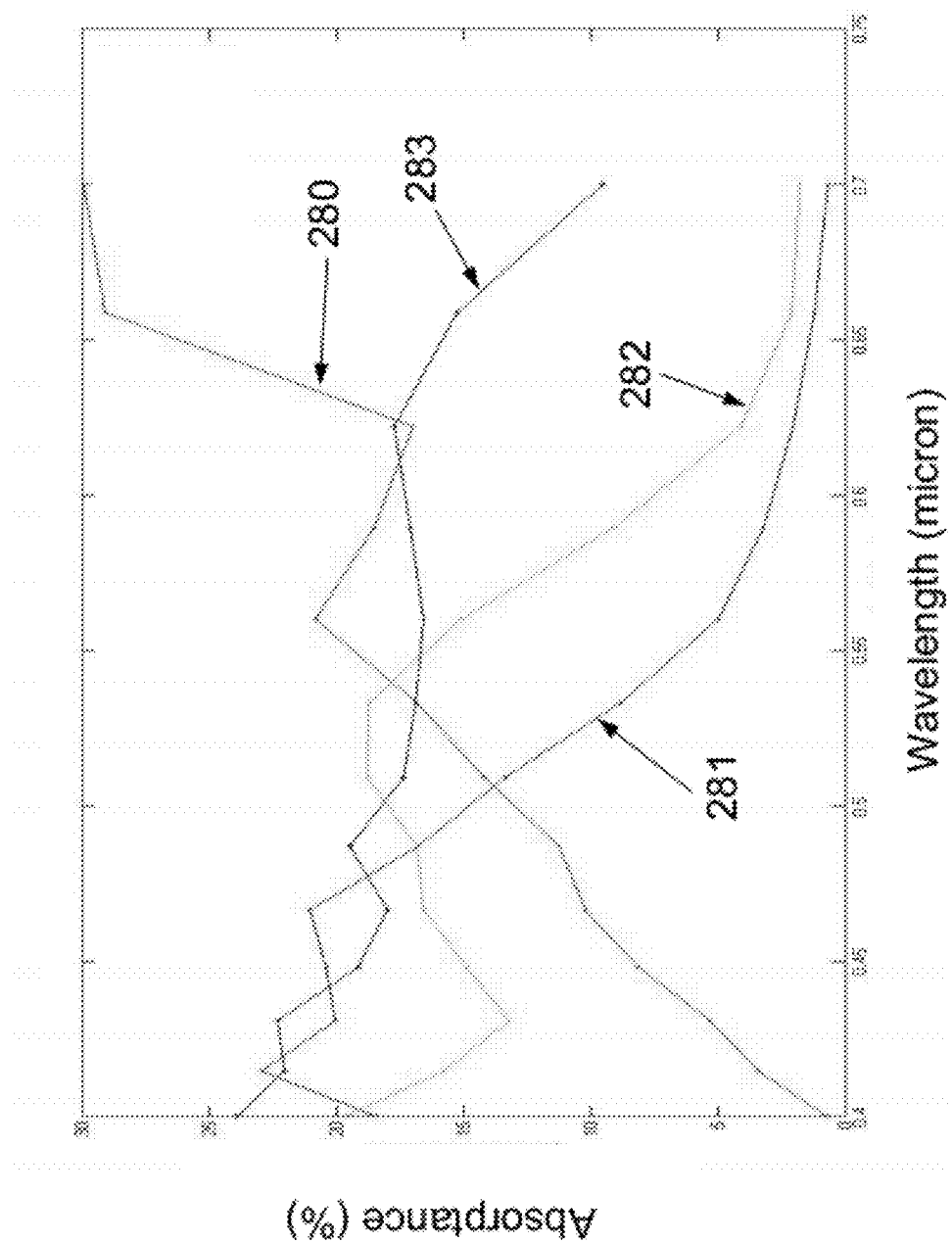
FIG. 2C shows exemplary absorption spectra of three nanowires in three subpixels in a pixel of the image sensor of FIG. 2A and the substrate of the image sensor of FIG. 2A.

The nanowires (e.g. 251a, 252a and 253a) in the subpixels (e.g. 251, 252 and 253) have refractive indexes equal to or greater than the refractive index of the clad 240. The nanowires and the substrate 210 have different absorption spectra. For example, the nanowire 251a has strong absorptance in blue wavelengths, as shown by an exemplary absorption spectrum 281 in FIG. 2C; the nanowire 252a has a strong absorptance in green wavelengths, as shown by an exemplary absorption spectrum 282 in FIG. 2C; the nanowire 253a has a strong absorptance across the entire visible spectrum, as shown by an exemplary absorption spectrum 283 in FIG. 2C; the substrate 210 has a strong absorptance in red wavelengths, as shown by an exemplary absorption spectrum 280 in FIG. 2C. The nanowires can have different diameters and/or different materials. Each nanowire in one pixel 250 preferably has a distance of at least 100 nm, preferable at least 200 nm, to a nearest neighboring nanowire in the same pixel. The nanowires in the clad 240 can be positioned at any suitable positions in the clad 240. The nanowires can have a surface passivation layer. The nanowires can comprise other suitable materials such as mercury cadmium telluride. The nanowires can have other suitable radii from 10 nm to 250 nm.

The nanowires (e.g. 251a, 252a and 253a) in the subpixels (e.g. 251, 252 and 253) are operable to generate electrical signals upon receiving light. One exemplary nanowire is a photodiode with a p-n or p-i-n junction therein, details of which can be found in U.S. patent application Ser. Nos. 12/575,221 and 12/633,305, each of which is hereby incorporated by reference in its entirety. The electrical signals can comprise an electrical voltage, an electrical current, an electrical conductance or resistance, and/or a change thereof.

Substantially all visible light impinged on the image sensor 200 is absorbed by the subpixels (e.g. 251, 252 and 253). The subpixels absorb light with different wavelengths.

The image sensor 200 can further comprise electronic circuitry 290 operable to detect electrical signals from the subpixels.

In one specific example, each pixel 250 has three subpixels 251, 252 and 253. Each subpixel 251, 252 and 253 has only one nanowire 251a, 252a and 253a, respectively. The nanowire 251a comprises silicon, has a radius of about 25 nm, and has a strong absorptance in blue wavelengths. The nanowire 252a comprises silicon, has a radius of about 40 nm and has a strong absorptance in green wavelengths. The nanowire 253a comprises silicon, has a radius of about 45 nm and has a strong absorptance across the entire visible spectrum. The nanowires 251a, 252a and 253a are about 200 nm apart but embedded in the same clad 240. The clad 140 is cylindrical in shape with a diameter of about 400 nm. Each of the pixels 250 can have more than three subpixels according to an embodiment.

Figure 2D:
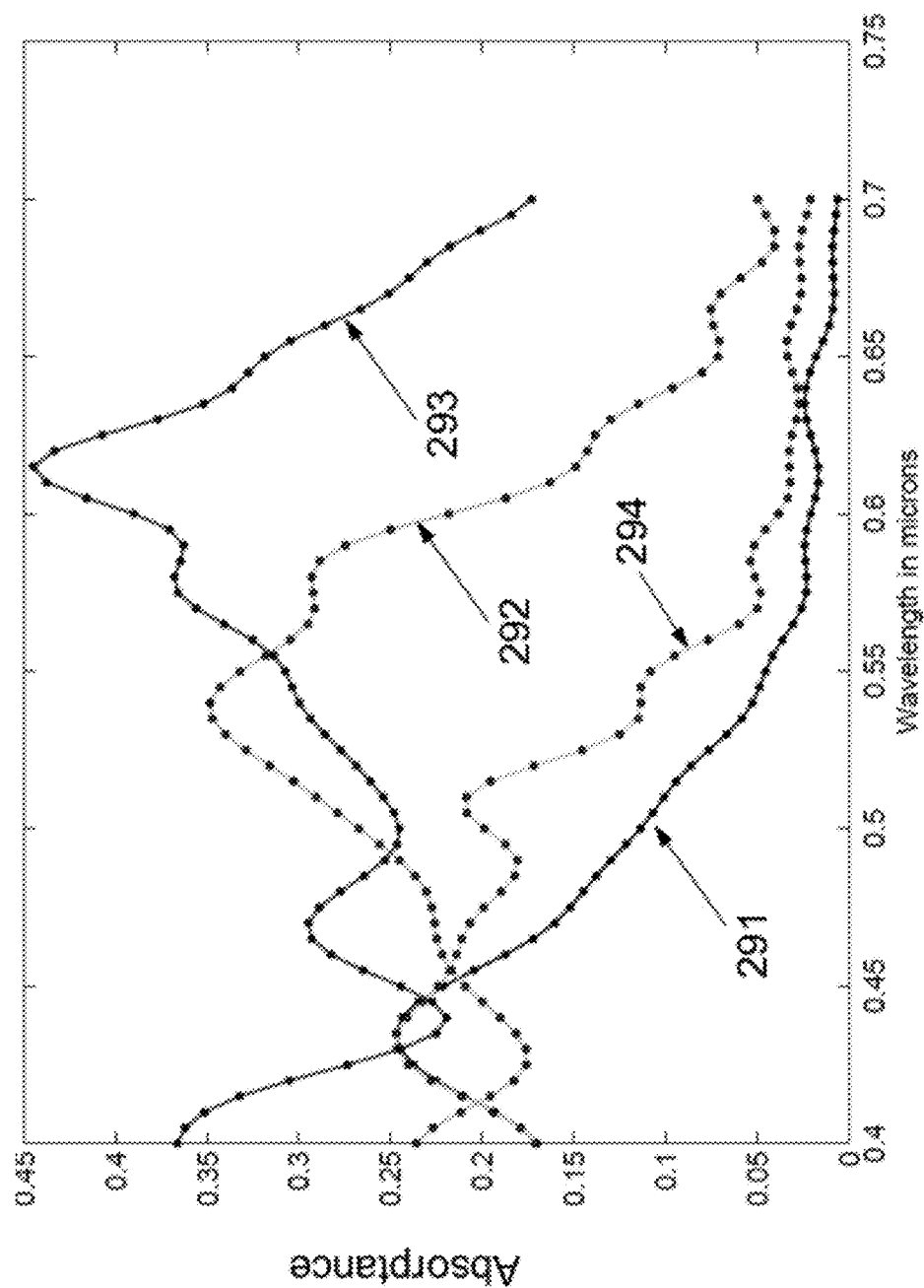
FIG. 2D shows exemplary absorption spectra of four nanowires in four subpixels in a pixel of the image sensor of FIG. 2A and the substrate of the image sensor of FIG. 2A.

In another specific example, each pixel 250 has four subpixels 251, 252, 253 and 254. Each subpixel 251, 252, 253 and 254 has only one nanowire 251a, 252a, 253a and 254a respectively. The nanowire 251a comprises silicon, has a radius of about 25 nm, and has a strong absorptance in blue wavelengths. The nanowire 252a comprises silicon, has a radius of about 40 nm and has a strong absorptance in green wavelengths. The nanowire 253a comprises silicon, has a radius of about 45 nm and has a strong absorptance across the entire visible spectrum. The nanowire 254a comprises silicon, has a radius of about 35 nm and has a strong absorptance in blue green wavelength (e.g. 400 to 550 nm). The nanowires 251a, 252a, 253a and 254a are about 200 nm apart but embedded in the same clad 240. The clad 140 is cylindrical in shape with a diameter of about 400 nm. FIG. 2D shows exemplary absorption spectra 291, 292, 293 and 294 of the nanowires 251a, 252a, 253a and 254a, respectively.

FIG. 2B shows a schematic partial top view of the image sensor 200. As shown in exemplary FIG. 2B, the pixels 250 can have different orientations, which reduces or eliminates effects of directions of incident light.

According to an embodiment, the image sensor 100 or 200 can further comprise couplers 350 above each pixel 150 or 250, as shown in FIG. 3. Each of the couplers 350 preferably has substantially the same footprint as the pixel underneath and has a convex surface. The coupler 350 is effective to focus substantially all visible light impinged thereon into the clad 140 or 240.

According to an embodiment, as shown in FIG. 3, the image sensor 100 or 200 can further comprise an infrared filter 360, which is operable to prevent infrared light, such as light with wavelengths above 650 nm, from reaching the pixels. According to an embodiment, the image sensor 100 or 200 does not comprise an infrared filter.

According an embodiment, the nanowires can be made by a dry etching process or a Vapor Liquid Solid (VLS) growth method. Of course, it will be appreciated that other materials and/or fabrication techniques may also be used for fabricating the nanowires in keeping with the scope of the invention. For instance, nanowires fabricated from an indium arsenide (InAs) wafer or related materials could be used for IR applications.

The nanowires can also be made to have a strong absorption in wavelengths not in the visible spectrum, such as in the ultraviolet (UV) or infrared (IR) spectra. In an embodiment, each nanowire can have transistor (e.g., transistor 151ab in FIG. 1A) therein or thereon.

In one embodiment, the subpixels 251, 252 and 253 in each pixel 250 of the image sensor 200 has color matching functions substantially the same as the color matching functions of the CIE 1931 2° Standard Observer or the CIE 1964 10° Standard Observer.

Figure 4:
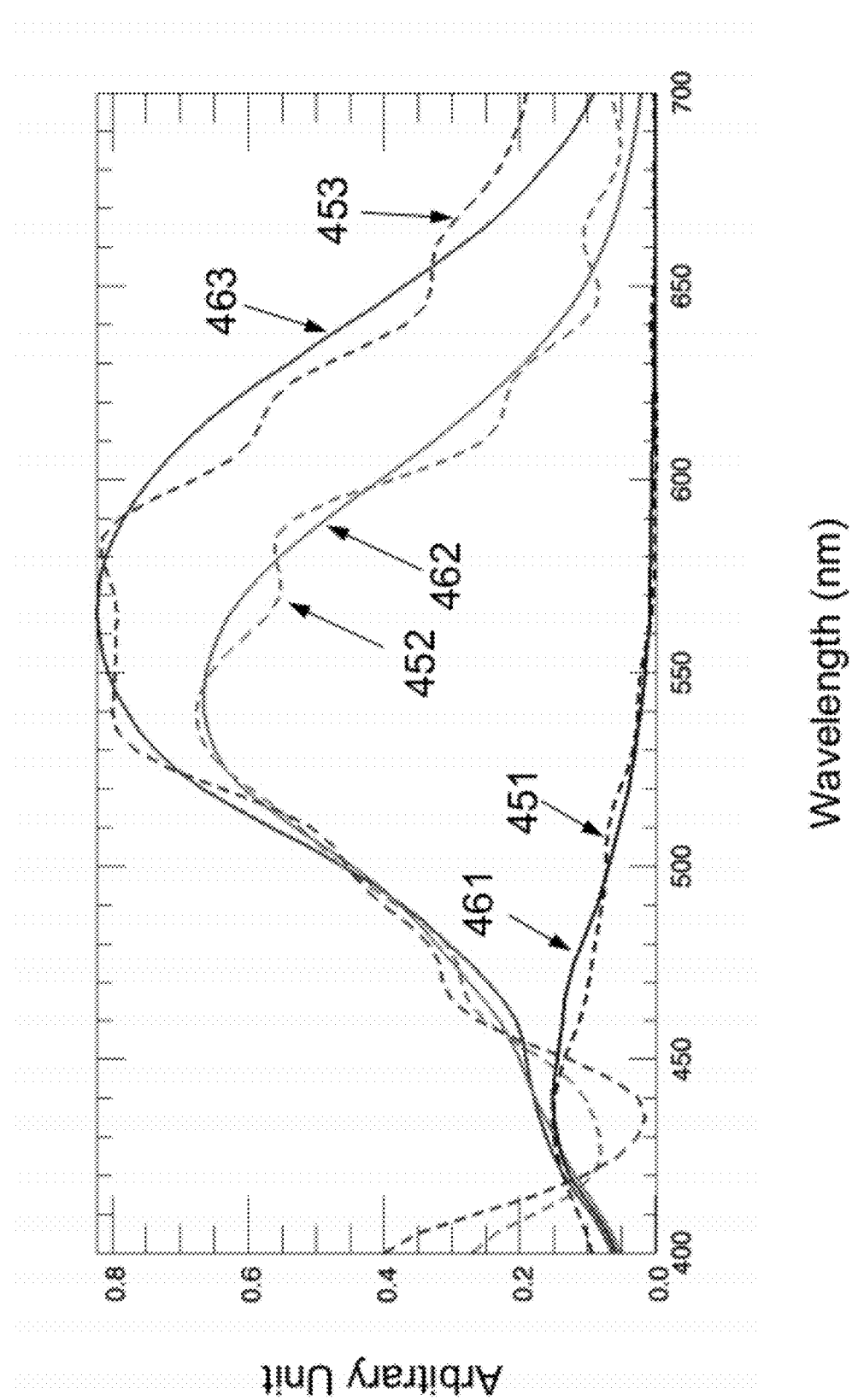
FIG. 4 shows exemplary color-matching functions of three subpixels in the image sensor, and color-matching functions the CIE standard observer.

FIG. 4 shows exemplary color-matching functions 451, 452 and 453 of the subpixels 251, 252 and 253, respectively. The color-matching functions 461, 462 and 463 are the $\bar{x}(\lambda)$, $\bar{y}(\lambda)$, and $\bar{z}(\lambda)$ of the CIE standard observer.

The image sensor 100 or 200 can be used to sense and capture images. A method of sensing an image comprises projecting the image onto the image sensor 100 or 200 using any suitable optics such as lenses and/or mirrors; detecting an electrical signal from the nanowire in each subpixel in each pixel using suitable circuitry; calculating a color of each pixel from the electrical signals of the subpixels therein.

The foregoing detailed description has set forth various embodiments of the devices and/or processes by the use of diagrams, flowcharts, and/or examples. Insofar as such diagrams, flowcharts, and/or examples contain one or more functions and/or operations, it will be understood by those within the art that each function and/or operation within such diagrams, flowcharts, or examples can be implemented, individually and/or collectively, by a wide range of hardware, software, firmware, or virtually any combination thereof.

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein can be integrated into a data processing system via a reasonable amount of experimentation.

The subject matter described herein sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermediate components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

All references, including but not limited to patents, patent applications, and non-patent literature are hereby incorporated by reference herein in their entirety.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. An image sensor comprising a substrate and one or more of pixels thereon, wherein each of the pixels comprises a first subpixel and a second subpixel; the first subpixel comprises a first nanowire operable to generate an electrical signal upon exposure to light of a first wavelength; the second subpixel comprises a second nanowire operable to generate an electrical signal upon exposure to light of a second wavelength different from the first wavelength; the first and second nanowires extend essentially perpendicularly from the substrate, wherein the first nanowire and/or the second nanowire has a transistor therein or thereon.

2. The image sensor of claim 1, wherein each pixel of the image sensor further comprises one or more photodiodes located between the substrate and the first and second nanowires.

3. The image sensor of claim 1, wherein the substrate comprises silicon, silicon oxide, silicon nitride, sapphire, diamond, silicon carbide, gallium nitride, germanium, indium gallium arsenide, lead sulfide and/or a combination thereof.

4. The image sensor of claim 1, wherein at least one pixel comprises a clad; the first subpixel and the second subpixel of the at least one pixel are embedded in the clad.

5. The image sensor of claim 4, further comprising a material in space between the pixels.

6. The image sensor of claim 4, wherein the clad comprises silicon nitride, silicon oxide, and/or a combination thereof.

7. The image sensor of claim 4, wherein the clad is substantially transparent to visible light.

8. The image sensor of claim 4, wherein the first and second nanowires have refractive indexes equal to or greater than a refractive index of the clad.

9. The image sensor of claim 5, wherein the material has a refractive index smaller than a refractive index of the clad.

10. The image sensor of claim 1, wherein the first nanowire and the second nanowire have different absorption spectra.

11. The image sensor of claim 1, wherein the first nanowire and the second nanowire have a distance of at least 100 nm.

12. The image sensor of claim 1, wherein each of the first and second nanowires has a p-n or p-i-n junction therein.

13. The image sensor of the claim 1, wherein the electrical signal comprise an electrical voltage, an electrical current, an electrical conductance or resistance, and/or a change thereof.

14. The image sensor of claim 1, wherein the first nanowire and/or the second nanowire has a surface passivation layer.

15. The image sensor of claim 1, being operable to absorb at least 50% of all visible light impinged thereon.

16. The image sensor of claim 1, further comprising electronic circuitry operable to detect electrical signals generated by the first and second nanowires.

17. The image sensor of claim 1, wherein the first and second nanowires comprise silicon.

18. The image sensor of claim 1, wherein the first nanowire has a radius of about 25 nm and the second nanowire has a radius of about 40 nm.

19. The image sensor of claim 4, wherein the clad has a cylindrical shape with a diameter of about 300 nm.

20. The image sensor of claim 1, wherein the pixels have different orientations.

21. The image sensor of claim 2, wherein the photodiodes have absorption spectra different from absorption spectra of the first and second nanowires.

22. The image sensor of claim 1, wherein each of the pixels further comprises a third subpixel and the third subpixel comprises a third nanowire operable to generate an electrical signal upon exposure to light of a third wavelength different from the first and second wavelengths, wherein the third nanowire extends essentially perpendicularly from the substrate.

23. The image sensor of claim 22, wherein the third nanowire comprises silicon.

24. The image sensor of claim 22, wherein the third nanowire has a radius of about 45 nm.

25. The image sensor of claim 22, wherein each of the pixels further comprises a fourth subpixel and the fourth subpixel comprises a fourth nanowire operable to generate an electrical signal upon exposure to light of a fourth wavelength different from the first, second and third wavelengths, wherein the fourth nanowire extends essentially perpendicularly from the substrate.

26. The image sensor of claim 25, wherein the fourth nanowire comprises silicon.

27. The image sensor of claim 25, wherein the fourth nanowire has a radius of about 40 nm.

28. The image sensor of claim 4, further comprising couplers above each of the pixels, each of the couplers having a convex surface and being effective to focus substantially all visible light impinged thereon into the clad.

29. The image sensor of claim 28, wherein each of the couplers has substantially the same footprint as the pixel underneath.

30. The image sensor of claim 1, further comprising an infrared filter operable to prevent infrared light from reaching the pixels.

31. The image sensor of claim 1, wherein the image sensor does not comprise an infrared filter.

32. The image sensor of claim 2, further comprising electronic circuitry operable to detect electrical signals from the photodiodes.

33. A method of manufacturing an image sensor, comprising dry etching or VLS growth, wherein the image sensor comprises a substrate and one or more of pixels thereon, wherein each of the pixels comprises at a first subpixel and a second subpixel, the first subpixel comprises a first nanowire operable to generate an electrical signal upon exposure to light of a first wavelength, the second subpixel comprises a second nanowire operable to generate an electrical signal upon exposure to light of a second wavelength different from the first wavelength, wherein the first and second nanowires extend essentially perpendicularly from the substrate, wherein the first nanowire and/or the second nanowire has a transistor therein or thereon.

34. A method of sensing an image comprises:
projecting the image onto an image sensor, wherein the image sensor comprises a substrate and one or more of pixels thereon, wherein each of the pixels comprises at a first subpixel and a second subpixel, the first subpixel comprises a first nanowire operable to generate an electrical signal upon exposure to light of a first wavelength, the second subpixel comprises a second nanowire operable to generate an electrical signal upon exposure to light of a second wavelength different from the first wavelength, wherein the first and second nanowires extend essentially perpendicularly from the substrate, wherein the first nanowire and/or the second nanowire has a transistor therein or hereon;
detecting the electrical signals from the first nanowire and the second nanowire; and
calculating a color of each pixel from the electrical signals.

35. The image sensor of claim 1, wherein the first nanowire and the second nanowire are embedded in a same clad.

36. The image sensor of claim 1, wherein at least one pixel comprises a clad; wherein the clad covers substantially an entire sidewall of the first nanowire.

37. The image sensor of claim 22, color-matching functions of the first, second and third subpixels are substantially the same as the color matching functions of the CIE 1931 2° Standard Observer or the CIE 196410° Standard Observer.

38. The image sensor of claim 1, wherein different pixels of the one or more of pixels comprise spatially separated clads.

* * * * *